(12) United States Patent
Kim

(10) Patent No.: US 8,238,401 B2
(45) Date of Patent: Aug. 7, 2012

(54) SILICON-BASED LENS SUPPORT STRUCTURE FOR DIODE LASER

(76) Inventor: Gerald Ho Kim, Carlsbad, CA (US)

( * ) Notice: Subject to any disclaimer, the term of this patent is extended or adjusted under 35 U.S.C. 154(b) by 0 days.

(21) Appl. No.: 12/546,287

(22) Filed: Aug. 24, 2009

(65) Prior Publication Data

US 2010/0046569 A1 Feb. 25, 2010

Related U.S. Application Data

(60) Provisional application No. 61/189,971, filed on Aug. 25, 2008.

(51) Int. Cl.
*H01S 3/08* (2006.01)

(52) U.S. Cl. .............. 372/107; 372/34; 372/33; 372/36; 372/50.12; 372/50.23; 257/81; 257/88; 257/99; 257/432; 359/618; 359/619; 359/620; 359/621

(58) Field of Classification Search .............. 372/33, 372/34, 36, 50.12, 50.23, 107, 101; 257/81, 257/88, 99, 432; 359/618, 641, 619–621, 359/625–628, 639–640, 813, 834; 361/703–710; 165/80.3, 185
See application file for complete search history.

(56) References Cited

U.S. PATENT DOCUMENTS

| | | | | |
|---|---|---|---|---|
| 4,897,711 A | * | 1/1990 | Blonder et al. ................. 257/48 |
| 5,081,639 A | * | 1/1992 | Snyder et al. .................. 372/101 |
| 5,181,216 A | * | 1/1993 | Ackerman et al. .............. 372/36 |
| 5,270,870 A | * | 12/1993 | O'Brien et al. ............... 359/820 |
| 5,828,683 A | * | 10/1998 | Freitas ............................. 372/36 |
| 5,907,151 A | * | 5/1999 | Gramann et al. ........... 250/214.1 |
| 5,963,577 A | * | 10/1999 | Snyder et al. ................. 372/101 |
| 6,295,307 B1 | * | 9/2001 | Hoden et al. ..................... 372/36 |
| 6,396,857 B1 | * | 5/2002 | Labranche et al. ............. 372/36 |
| 6,625,188 B2 | * | 9/2003 | Ono et al. ................... 372/43.01 |
| 6,647,035 B1 | * | 11/2003 | Freitas et al. .................... 372/36 |
| 7,508,065 B2 | * | 3/2009 | Sherrer et al. ................ 257/704 |
| 7,589,898 B2 | * | 9/2009 | Shigemura et al. ........... 359/619 |
| 7,864,825 B2 | * | 1/2011 | Thiagarajan et al. ........... 372/36 |
| 8,018,656 B2 | * | 9/2011 | Ito ................................. 359/622 |

(Continued)

*Primary Examiner* — Jessica Stultz
*Assistant Examiner* — Delma R Forde
(74) *Attorney, Agent, or Firm* — Han IP Law PLLC; Andy M. Han

(57) ABSTRACT

An apparatus that includes a first diode laser and a silicon-based support structure is provided. The first diode laser is configured to emit a first laser beam when powered. The support structure includes a silicon-based support plate, a silicon-based first fin structure, and a silicon-based second fin structure. The support plate has a first primary surface and a second primary surface opposite the first primary surface. The first fin structure has a first primary surface, a second primary surface opposite the first primary surface, and a plurality of edges between the first and the second primary surfaces including a first edge and a second edge opposite the first edge. The first fin structure is physically coupled to the support plate with the first edge of the first fin structure attached to the first primary surface of the support plate. The second fin structure has a first primary surface, a second primary surface opposite the first primary surface, and a plurality of edges between the first and the second primary surfaces including a first edge and a second edge opposite the first edge. The second fin structure is physically coupled to the support plate with the first edge of the second fin structure attached to the first primary surface of the support plate. The first diode laser is physically coupled between the first and the second fin structures to emit the first laser beam in a direction away from the support plate.

35 Claims, 14 Drawing Sheets

U.S. PATENT DOCUMENTS

2004/0013140 A1* 1/2004 Ono et al. .................. 372/36
2004/0160675 A1* 8/2004 Nemoto et al. ............. 359/626
2006/0001055 A1* 1/2006 Ueno et al. ................. 257/257
2008/0217640 A1* 9/2008 Suzuki et al. ............... 257/98
2009/0121253 A1* 5/2009 Abe ............................. 257/99
2009/0309116 A1* 12/2009 Kato et al. .................. 257/98
2010/0000718 A1* 1/2010 Kim ......................... 165/104.19

* cited by examiner

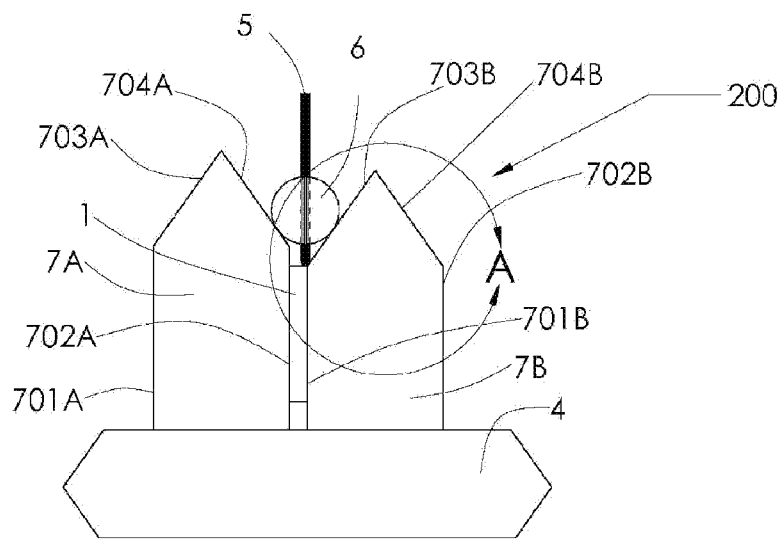
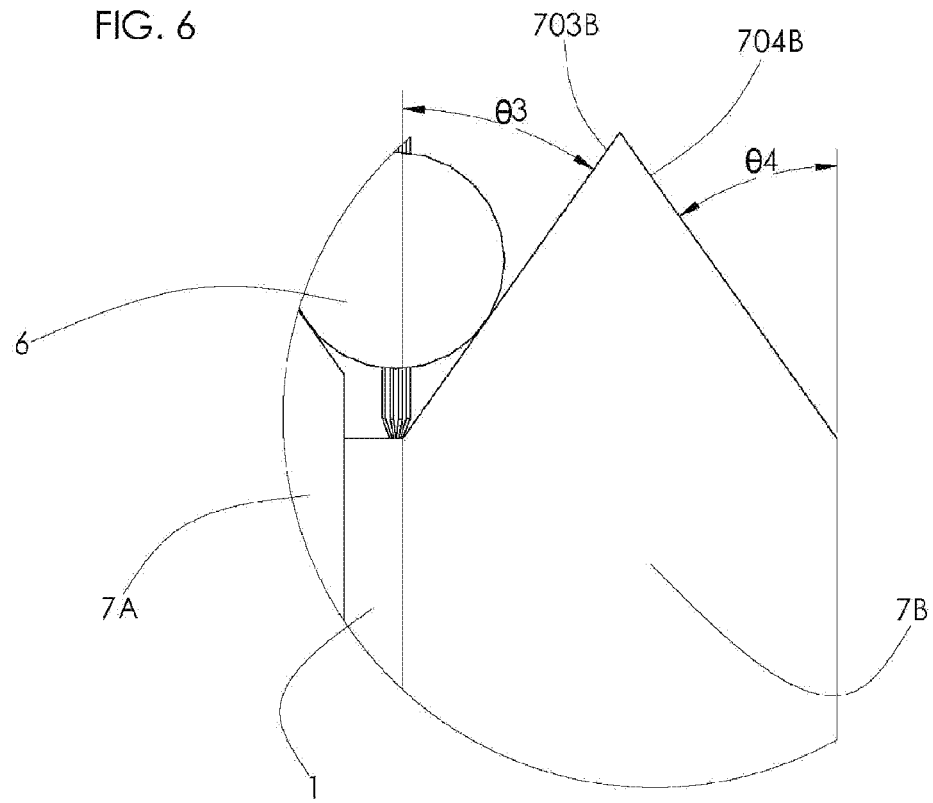
FIG. 6
FIG. 6A

SILICON-BASED LENS SUPPORT STRUCTURE FOR DIODE LASER

CROSS-REFERENCE TO RELATED APPLICATION

This application claims the benefit under 35 U.S.C. §119 (e) of U.S. Provisional Patent Application Ser. No. 61/189,971, filed Aug. 25, 2008, entitled "Silicon Micro-Etched Lens Mounting Structure for Diode Laser", which is incorporated herein by reference in its entirety.

BACKGROUND

1. Technical Field

The present disclosure generally relates to the field of collimation of emitted light and, more particularly, to collimating light emitted from diode laser with a lens supported by a silicon-based lens support structure.

2. Description of the Related Art

High-power direct diode lasers are gaining popularity in applications such as heat treating and cutting in the automobile and material processing industries. To heat or cut a material, the radiance of the diode laser has to be high enough to process the material effectively. Manufacturers of diode lasers have developed single-stack and multi-stack diode lasers with an attached collimating lens to collimate light emitted from the fast-axis of diode lasers. Fast-axis collimation is possible to within a few milli-radians of divergence of the laser beam when a collimating lens is used. A collimating lens is typically a rod lens or high numerical aperture cylindrical lens, and each diode laser typically has a collimating lens attached to the fast-axis, which is placed about a few tens or hundreds of microns in front of a facet of the diode laser.

To maintain a perfectly parallel beam of light, the collimating lens has to be placed within a few tens or hundreds of microns from the diode laser facet, with some variational dependence on the optical working distance of the collimating lens. This requires alignment of the collimating lens with the diode laser. It is not easy to passively align the collimating lens to perfectly collimate the laser beam, and many hours of alignment and special tools are usually required to assemble a diode laser package that includes one or more diode laser and the respective one or more collimating lens. Alternatively, alignment of the collimating lens can be provided via active alignment, in which alignment is provided on a real-time basis. However, active alignment can be particularly difficult for a high-power diode stack due to the large number of closely packaged diode lasers.

In the case of a multi-stack diode laser, each individual diode laser has to be collimated and the respective collimating lens is attached to the diode laser package structure. In aligning each collimating lens, the diode laser is running at the operating current and the collimating lens is aligned with a tooling setup that allows for movement of the collimating lens in a four- or five-axis controlled mechanical stage. After the alignment, the collimating lens is attached to the frame of the diode laser by, for example, UV-curing epoxy or a soldering process. However, failure of diode laser alignment is not uncommon. Typically, alignment of the diode laser fails due to weak bonding of the epoxy or degradation of the epoxy joint caused by thermal cycles of the diode laser.

There is, therefore, a need for a novel mechanical structure to align the collimating lens to provide optimal collimation and to hold the collimating lens in place to withstand many thermal cycles of the diode laser.

BRIEF SUMMARY

In one aspect, an apparatus may be summarized as including a first diode laser and a silicon-based support structure. The first diode laser is configured to emit a first laser beam when powered. The support structure includes a silicon-based support plate, a silicon-based first fin structure, and a silicon-based second fin structure. The support plate has a first primary surface and a second primary surface opposite the first primary surface. The first fin structure has a first primary surface, a second primary surface opposite the first primary surface, and a plurality of edges between the first and the second primary surfaces including a first edge and a second edge opposite the first edge. The first fin structure is physically coupled to the support plate with the first edge of the first fin structure attached to the first primary surface of the support plate. The second fin structure has a first primary surface, a second primary surface opposite the first primary surface, and a plurality of edges between the first and the second primary surfaces including a first edge and a second edge opposite the first edge. The second fin structure is physically coupled to the support plate with the first edge of the second fin structure attached to the first primary surface of the support plate. The first diode laser is physically coupled between the first and the second fin structures to emit the first laser beam in a direction away from the support plate.

The apparatus may further include a collimating device received between the first and the second fin structures and positioned to collimate the first laser beam emitted from the first diode laser. In one embodiment, the collimating device may comprise a rod lens. In another embodiment, the collimating device may comprise a substantially cylindrical lens with a high numerical aperture. In yet another embodiment, the collimating device may comprise a rod lens having at least one substantially flat surface along a longitudinal axis of the rod lens. In still another embodiment, the collimating device may comprise an optical lens having a numerical aperture value in the range of 0.20 to 0.80. The collimating device may be attached to at least one of the first and the second fin structures by UV-curing epoxy bonding. Alternatively, the collimating device may be attached to at least one of the first and the second fin structures by soldering.

The support plate may include at least a first groove and a second groove on the first primary surface of the support plate. The first fin structure may be attached to the support plate with the first edge of the first fin structure received in the first groove of the support plate. The second fin structure may be attached to the support plate with the first edge of the second fin structure received in the second groove of the support plate.

At least one of the support plate, the first fin structure, and the second fin structure may be made from a single-crystal silicon wafer. In one embodiment, at least one of the first and the second fin structures may be made from a single-crystal silicon wafer that has a <100> silicon crystal plane as a face plane, and at least one edge of at least one of the first and the second fin structures may be etched to form at least one sloped surface having an angle of 54.7 degrees between the <100> and a <111> silicon crystal planes. In another embodiment, at least one of the first and the second fin structures may be made from a single-crystal silicon wafer that has a <110> silicon crystal plane as a face plane, and at least one edge of at least one of the first and the second fin structures may be etched to form at least one sloped surface having an angle of 35.3 degrees between the <110> and a <111> silicon crystal planes. In one embodiment, at least a portion of the primary surface of the first fin structure that the first light emitter is physically coupled to may be metalized, and at least a portion of the primary surface of the second fin structure that the first light emitter is physically coupled to may be metalized. In another embodiment, the second primary surface of the first fin structure may include a recessed portion, and the first light emitter may be physically coupled to the recessed portion of the second primary surface of the first fin structure.

The apparatus may further include a second diode laser configured to emit a second laser beam when powered and a silicon-based third fin structure. The silicon-based third fin structure has a first primary surface, a second primary surface opposite the first primary surface, and a plurality of edges between the first and the second primary surfaces including a first edge and a second edge opposite the first edge. The third fin structure is physically coupled to the support plate with the first edge of the third fin structure attached to the first primary surface of the support plate. The second diode laser is physically coupled between the second and the third fin structures to emit the second laser beam in a direction away from the support plate.

In another aspect, an apparatus may be summarized as including a silicon-based support plate, a silicon-based first fin structure, and a silicon-based second fin structure. The support plate has a first primary surface and a second primary surface opposite the first primary surface. The first fin structure has a first primary surface, a second primary surface opposite the first primary surface, and a plurality of edges between the first and the second primary surfaces including a first edge and a second edge opposite the first edge. The first fin structure is physically coupled to the support plate with the first edge of the first fin structure attached to the first primary surface of the support plate. The second fin structure has a first primary surface, a second primary surface opposite the first primary surface, and a plurality of edges between the first and the second primary surfaces including a first edge and a second edge opposite the first edge. The second fin structure is physically coupled to the support plate with the first edge of the second fin structure attached to the first primary surface of the support plate. At least one of the primary surfaces of the first fin structure is substantially parallel to at least one of the primary surfaces of the second fin structure when the first and the second fin structures are attached to the support plate. The first fin structure and the second fin structure are spaced apart by a distance that is approximately a thickness of a first light emitter to allow the first light emitter to be physically coupled between the first and the second fin structures. At least a portion of at least one of the first and the second primary surfaces of each of the first and the second fin structures is metalized.

The support plate may include at least a first groove and a second groove on the first primary surface of the support plate. The first fin structure may be attached to the support plate with the first edge of the first fin structure received in the first groove of the support plate. The second fin structure may be attached to the support plate with the first edge of the second fin structure received in the second groove of the support plate.

At least one of the support plate, the first fin structure, and the second fin structure may be made from a single-crystal silicon wafer. In one embodiment, at least one of the first and the second fin structures may be made from a single-crystal silicon wafer that has a <100> silicon crystal plane as a face plane, and at least one edge of at least one of the first and the second fin structures may be etched to form at least one sloped surface having an angle of 54.7 degrees between the <100> and a <111> silicon crystal planes. In another embodiment, at least one of the first and the second fin structures may be made from a single-crystal silicon wafer that has a <110> silicon crystal plane as a face plane, and at least one edge of at least one of the first and the second fin structures may be etched to form at least one sloped surface having an angle of 35.3 degrees between the <110> and a <111> silicon crystal planes. In one embodiment, the support plate may be made from a single-crystal silicon wafer and may have a <100> silicon crystal plane as the first primary surface, and at least one of the first and the second grooves may be a V-notch groove having two slopes each having an angle of 54.7 degrees measured from the first primary surface. In another embodiment, the support plate may be made from a single-crystal silicon wafer and may have a <110> silicon crystal plane as the first primary surface, and at least one of the first and the second grooves may be a V-notch groove having two slopes each having an angle of 35.3 degrees measured from the first primary surface. In yet another embodiment, the support plate may be made from a single-crystal silicon wafer and may have a <100> silicon crystal plane as the first primary surface, and at least one of the first and the second grooves may be a rectangular groove.

In one embodiment, at least a portion of the primary surface of the first fin structure that the first light emitter is physically coupled to may be metalized, and at least a portion of the primary surface of the second fin structure that the first light emitter is physically coupled to may be metalized. In another embodiment, the second primary surface of the first fin structure may include a recessed portion, and the first light emitter may be physically coupled to the recessed portion of the second primary surface of the first fin structure. At least one of the first and the second fin structures may be attached to the support plate by metal soldering, epoxy boding, eutectic bonding, anodic bonding, diffusion bonding, or a combination thereof.

The apparatus may also include the first light emitter that is physically coupled between the first and the second fin structures. In one embodiment, the first light emitter may comprise a light-emitting diode. In another embodiment, the first light emitter may comprise a diode laser.

The apparatus may further include a collimating device received between the first and the second fin structures and positioned to collimate the first beam of light emitted from the first light emitter. In one embodiment, the collimating device may comprise a rod lens. In another embodiment, the collimating device may comprise a substantially cylindrical lens with a high numerical aperture. In yet another embodiment, the collimating device may comprise a rod lens having at least one substantially flat surface along a longitudinal axis of the rod lens. In still another embodiment, the collimating device may comprise an optical lens having a numerical aperture value in the range of 0.20 to 0.80. The collimating device may be attached to at least one of the first and the second fin structures by UV-curing epoxy bonding. Alternatively, the collimating device may be attached to at least one of the first and the second fin structures by soldering.

The apparatus may further include a second light emitter configured to emit a second beam of light when powered and a silicon-based third fin structure. The third fin structure may have a first primary surface, a second primary surface opposite the first primary surface, and a plurality of edges between the first and the second primary surfaces including a first edge and a second edge opposite the first edge. The third fin structure may be physically coupled to the support plate with the first edge of the third fin structure attached to the first primary surface of the support plate. The second light emitter may be physically coupled between the second and the third fin structures to emit the second beam of light in a direction away from the support plate.

BRIEF DESCRIPTION OF THE SEVERAL VIEWS OF THE DRAWINGS

FIGS. 6 and 6A are each a side view of the apparatus shown in FIG. 4 according to another non-limiting illustrated embodiment.

DETAILED DESCRIPTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with diode lasers, solar cells, heat exchangers and heat pipes have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings and Abstract of the Disclosure provided herein are for convenience only and do not interpret the scope or meaning of the embodiments.

Currently, methods to etch a single-crystal silicon wafer to make V-notch grooves or V-notch derived grooves are known. A single-crystal silicon wafer can be etched to form a V-notch groove, V-notch derived groove, or a rectangular groove on a surface of the silicon wafer. Many V-notch grooves are used, for example, to position or mount fiber optics for precision alignment purposes. Various V-notch groove angles, relative to a face plane of a single-crystal silicon wafer, can be achieved by etching in an anisotropic chemical process. All of the silicon V-notch groove half angles, units in degrees, are listed in Table 1 below.

TABLE 1

| Angles between Crystal Planes | | | | | |
|---|---|---|---|---|---|
| Angle between planes | <100> plane | <110> plane | <010> plane | <001> plane | <101> plane |
| <100> plane | 0.00 | 45.0 | 90.0 | 90.0 | 45.0 |
| <011> plane | 90.0 | 60.0 | 45.0 | 45.0 | 60.0 |
| <111> plane | 54.7 | 35.3 | 54.7 | 54.7 | 35.3 |
| <211> plane | 35.2 | 30.0 | 65.9 | 65.9 | 30.0 |
| <311> plane | 25.2 | 31.4 | 72.4 | 72.4 | 31.4 |
| <511> plane | 15.8 | 35.2 | 78.9 | 78.9 | 35.2 |
| <711> plane | 11.4 | 37.6 | 81.9 | 81.9 | 37.6 |

Accordingly, V-notch grooves, V-notch derived grooves, and rectangular grooves can be engineered on a support plate component to interlock with other components to support construction of a three-dimensional structure out of a face plane on the support plate where one or more grooves are located.

Figure 1:
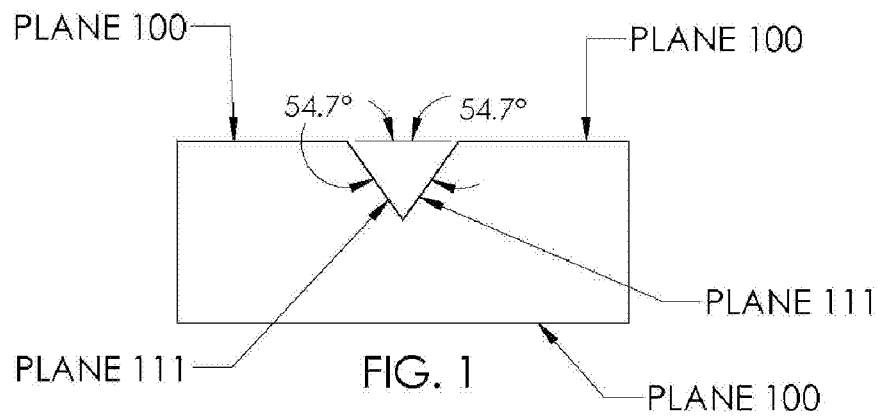
FIGS. 1-3 are each a diagram showing a cross-sectional view of a chemically etched groove in a single-crystal silicon wafer according to one non-limiting illustrated embodiment.
Figure 2:
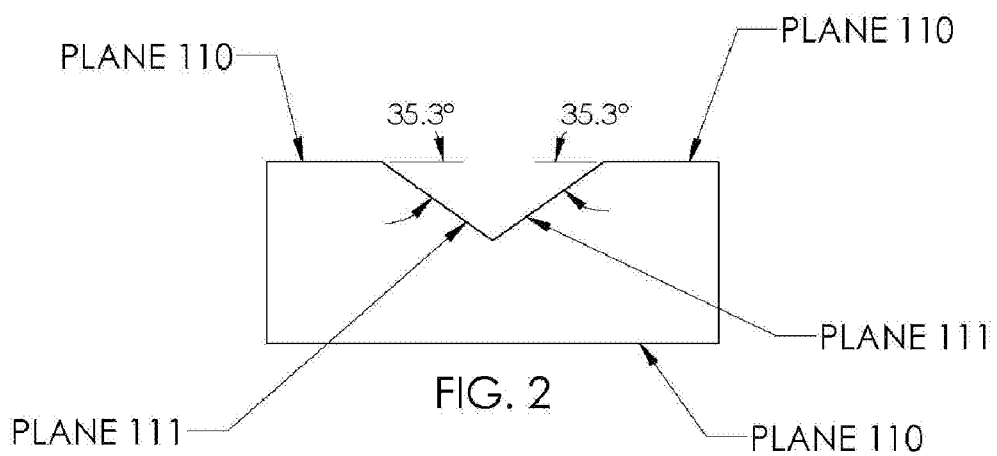
Figure 3:
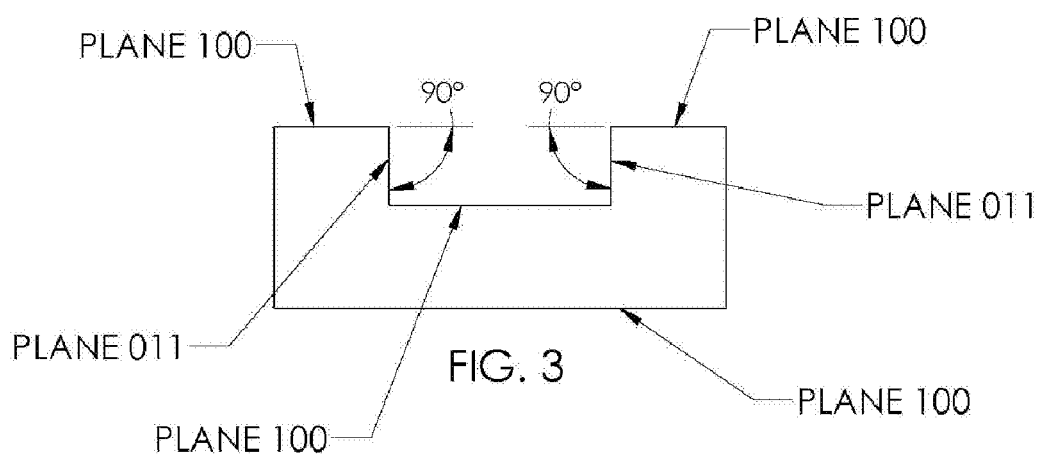

Each of FIGS. 1-3 illustrates a cross-sectional view of a chemically etched groove in a single-crystal silicon wafer according to one non-limiting illustrated embodiment.

FIG. 1 illustrates a cross-sectional view of a V-notch groove on a top surface of a single-crystal silicon wafer etched by potassium hydroxide (KOH) or by other chemical process. The silicon wafer shown in FIG. 1 has a <100> silicon crystal plane as a face plane. An angle of 54.7 degrees results when an etched plane and the face plane of the silicon wafer when the etched plane coincides with a <111> silicon crystal plane of the silicon wafer. The single-crystal silicon wafer may also be etched to produce an edge in the form of a V-shaped wedge that is substantially complementary to the V-notch groove etched on the top surface of the silicon wafer. That is, such edge has a V-shaped wedge that can fit complementarily in the V-notch groove.

FIG. 2 illustrates a cross-sectional view of a V-notch groove on a top surface of a single-crystal silicon wafer etched by KOH or by other chemical process. The silicon wafer shown in FIG. 2 has a <110> silicon crystal plane as a face plane. An angle of 35.3 degrees results when an etched plane and the face plane of the silicon wafer when the etched plane coincides with a <111> silicon crystal plane of the silicon wafer. The single-crystal silicon wafer may also be etched to produce an edge in the form of a V-shaped wedge that is substantially complementary to the V-notch groove etched on the top surface of the silicon wafer. That is, such edge has a V-shaped wedge that can fit complementarily in the V-notch groove.

FIG. 3 illustrates a cross-sectional view of a rectangular groove on a top surface of a single-crystal silicon wafer etched by KOH or by other chemical process. The silicon wafer shown in FIG. 3 has a <100> silicon crystal plane as a face plane. An angle of 90.0 degrees results when an etched plane and the face plane of the silicon wafer when the etched plane coincides with a <011> silicon crystal plane of the silicon wafer. The single-crystal silicon wafer may also be etched to produce an edge in the form of a rectangular wedge that is substantially complementary to the rectangular groove etched on the top surface of the silicon wafer. That is, such edge has a rectangular wedge that can fit complementarily in the rectangular groove.

It should be understood that the various shapes of grooves as illustrated in FIGS. 1-3 are only some of the embodiments and should not be construed as an exhaustive listing of all the embodiments within the scope of the present disclosure. Furthermore, although the illustrated embodiments are directed to a single-crystal silicon wafer, other non-metal materials including multi-crystal silicon wafers and ceramic materials, such as beryllium oxide, aluminum oxide, or silicon carbide for example, may be used as the material from which components of the embodiments disclosed herein can be fabricated. Grooves of other shapes achievable by etching or cutting a single-crystal silicon wafer, a multi-crystal silicon wafer, another silicon-based material, or a ceramic material are also within the scope of the present disclosure.

Figure 4:
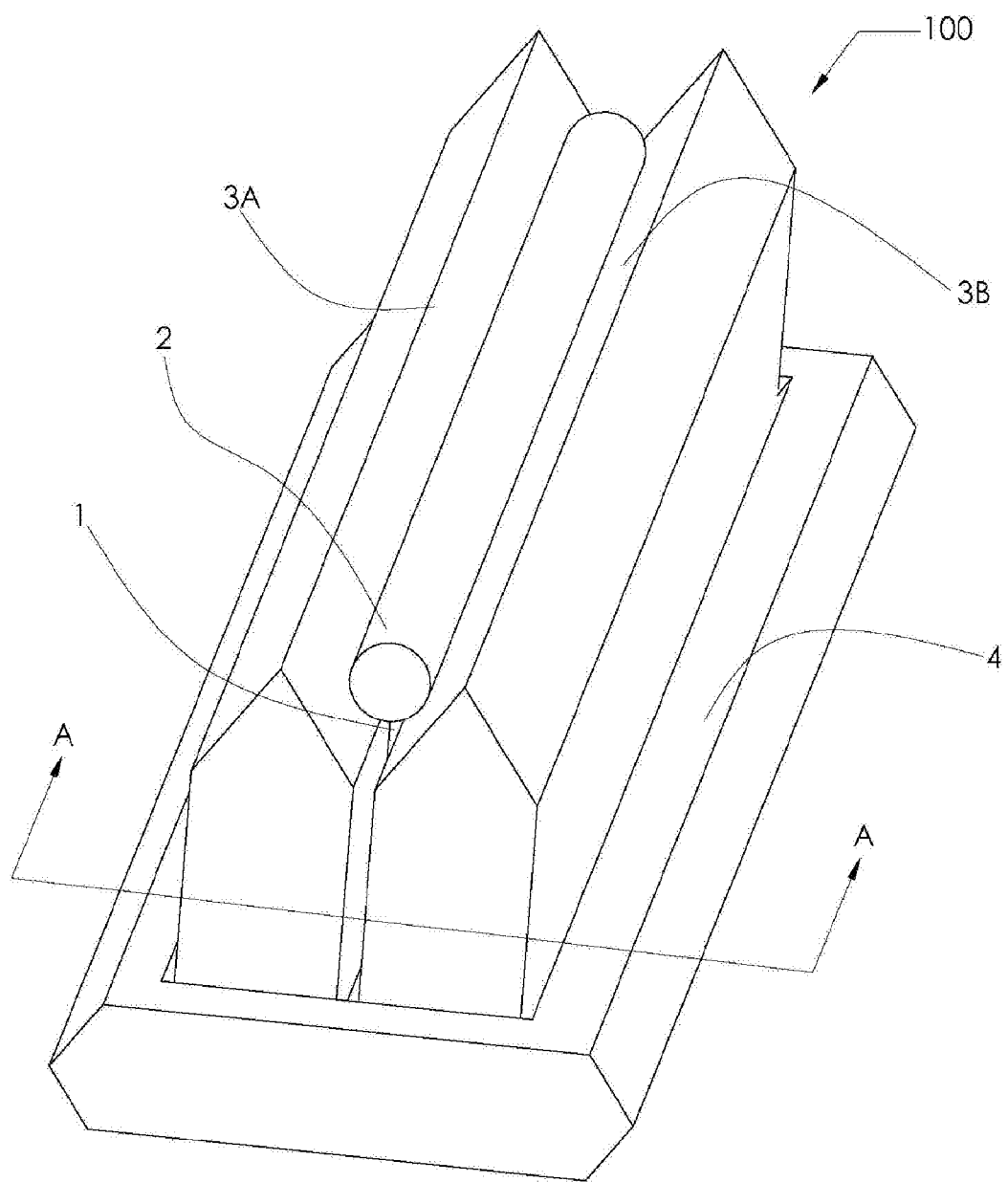
FIG. 4 is an assembly diagram of an apparatus according to one non-limiting illustrated embodiment.

FIG. 4 illustrates an apparatus 100 according to one non-limiting illustrated embodiment. The apparatus 100 includes a silicon-based support plate 4, a silicon-based first fin structure 3A, and a silicon-based second fin structure 3B. In one embodiment, at least one of the support plate 4, the first fin structure 3A and the second fin structure 3B is made from a single-crystal silicon wafer. In another embodiment, each of the support plate 4, the first fin structure 3A and the second fin structure 3B is made from a respective one or the same single-crystal silicon wafer. The support plate 4 has a first primary surface and a second primary surface opposite the first primary surface. Each of the first fin structure 3A and the second fin structure 3B has a first primary surface, a second primary surface opposite the first primary surface, and a plurality of edges between the first and the second primary surfaces including a first edge and a second edge opposite the first edge. The first fin structure 3A is physically coupled to the support plate 4 with the first edge of the first fin structure 3A attached to the first primary surface of the support plate 4. The second fin structure 3B is physically coupled to the support plate 4 with the first edge of the second fin structure 3B attached the first primary surface of the support plate 4. In one embodiment, the first and the second fin structures 3A, 3B are attached to the support plate 4 in a manner such that at least one of the primary surfaces of the first fin structure 3A is substantially parallel to at least one of the primary surfaces of the second fin structure 3B. In another embodiment, at least one of the first and the second fin structures 3A, 3B is attached to the support plate 4 by metal soldering, epoxy boding, eutectic bonding, anodic bonding, diffusion bonding, or a combination thereof.

As shown in FIG. 4, the apparatus 100 may also include a light emitter 1. In one embodiment, the light emitter 1 is a diode laser, such as a laser diode bar. In another embodiment, the light emitter 1 is a light-emitting diode. The light emitter 1 is physically coupled between the first fin structure 3A and the second fin structure 3B. More specifically, the light emitter 1 is physically coupled between the first fin structure 3A and the second fin structure 3B such that the beam of light, such as a laser beam in the case that the light emitter 1 is a diode laser, is emitted in a direction away from the support plate 4. When attached to the support plate 4, the first fin structure 3A and the second fin structure 3B are spaced apart by a distance that is approximately a thickness of the light emitter 1 to allow the light emitter 1 to be physically coupled between the first and the second fin structures 3A, 3B. In one embodiment, the primary surface of the first fin structure 3A that the light emitter 1 is physically coupled to includes a recessed portion, and the light emitter 1 is physically coupled to the recessed portion of that primary surface of the first fin structure 3A. In another embodiment, the primary surface of the second fin structure 3B that the light emitter 1 is physically coupled to includes a recessed portion, and the light emitter 1 is physically coupled to the recessed portion of that primary surface of the first fin structure 3B.

In one embodiment, the surfaces of each of the first and the second fin structures 3A, 3B are metalized. In another embodiment, at least a portion of at least one of the first and the second primary surfaces of each of the first and the second fin structures 3A, 3B is metalized. That is, at least a portion of the surface of each of the fin structures 3A, 3B that is in physical contact with the light emitter 1 is metalized to provide electrical conductivity to allow electrical power to be provided to the light emitter 1. Powering of the light emitter 1 is well known in the art. Thus, in the interest of brevity, detailed description of powering of the light emitter 1 will not be provided herein and the associated wiring and circuitry will not be shown in the figures.

In one embodiment, the first primary surface of the support plate 4 includes indentation for the first and the second fin structures 3A, 3B to attach to. For example, the support plate 4 may include at least a first groove and a second groove on the first primary surface. The first fin structure 3A may be attached to the support plate 4 with the first edge of the first fin structure 3A received in the first groove of the support plate 4. Likewise, the second fin structure 3B may be attached to the support plate 4 with the first edge of the second fin structure 3B received in the second groove of the support plate 4. In one embodiment, the support plate 4 is a single-crystal silicon wafer having a <100> silicon crystal plane as the first primary surface, and at least one of the first and the second grooves is a V-notch groove having two slopes each having an angle of 54.7 degrees measured from the first primary surface as shown in FIG. 1. In another embodiment, the support plate 4 is a single-crystal silicon wafer having a <110> silicon crystal plane as the first primary surface, and at least one of the first and the second grooves is a V-notch groove having two slopes each having an angle of 35.3 degrees measured from the first primary surface as shown in FIG. 2. In yet another embodiment, the support plate 4 is a single-crystal silicon wafer having a <100> silicon crystal plane as the first primary surface, and at least one of the first and the second grooves is a rectangular groove as shown in FIG. 3.

In one embodiment, at least one of the first and the second fin structures 3A, 3B is made from a single-crystal silicon wafer that has a <100> silicon crystal plane as a face plane, and at least one edge of at least one of the first and the second fin structures 3A, 3B is etched to form at least one sloped surface having an angle of 54.7 degrees between the <100> and a <111> silicon crystal planes. In another embodiment, at least one of the first and the second fin structures 3A, 3B is made from a single-crystal silicon wafer that has a <110> silicon crystal plane as a face plane, and at least one edge of at least one of the first and the second fin structures 3A, 3B is etched to form at least one sloped surface having an angle of 35.3 degrees between the <110> and a <111> silicon crystal planes.

As shown in FIG. 4, the apparatus 100 may further include a collimating device 2. The collimating device is received, or otherwise attached, between the first and the second fin structures 3A, 3B and positioned to collimate the beam of light emitted from the light emitter 1. In one embodiment, the collimating device 2 is a rod lens. In another embodiment, the collimating device 2 is a substantially cylindrical lens with a high numerical aperture. In yet another embodiment, the collimating device 2 is a rod lens having at least one substantially flat surface along a longitudinal axis of the rod lens. In still another embodiment, the collimating device 2 is an optical lens having a numerical aperture value in the range of 0.20 to 0.80 for collimation of the beam of light emitted by the light emitter 1. In one embodiment, the collimating device 2 is attached to at least one of the first and the second fin structures 3A, 3B by UV-curing epoxy bonding. Alternatively, the collimating device 2 is attached to at least one of the first and the second fin structures 3A, 3B by soldering.

Figure 5:
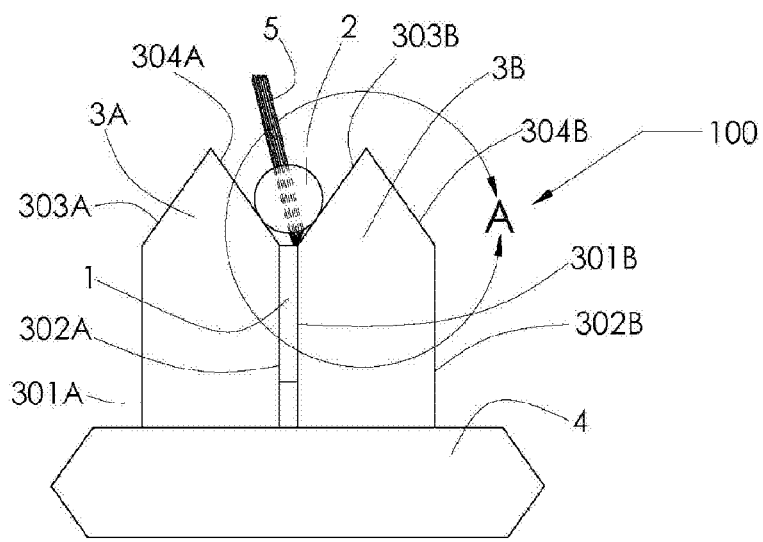
FIGS. 5 and 5A are each a side view of the apparatus shown in FIG. 4 according to one non-limiting illustrated embodiment.

FIG. 5 illustrates a side view of the apparatus 100 according to one non-limiting illustrated embodiment. The light emitter 1 is physically coupled between the first fin structure 3A and the second fin structure 3B, which are attached to the support plate 4. The first fin structure 3A has primary surfaces 301A, 302A and a second edge having sloped surfaces 303A, 304A. The second fin structure 3B has primary surfaces 301B, 302B and a second edge having sloped surfaces 303B, 304B. In one embodiment, the first and the second fin structures 3A, 3B are each made from a single-crystal silicon wafer and have symmetric shapes. At least a portion of some or all of the surfaces 301A, 302A, 303A, 304A of the first fin structure 3A and the surfaces 301B, 302B, 303B, 304B of the second fin structure 3B are metalized.

A collimating device 2 is attached to the sloped surface 304A of the first fin structure 3A and the sloped surface 303B of the second fin structure 3B. In one embodiment, the light emitter 1 is a laser diode bar that emits a laser beam 5. The laser beam 5 emits from one side of light emitter 1 as shown in FIG. 5 and propagates through the collimating device 2. With the collimating device 2 positioned and distanced appropriately from the light emitter 1, the laser beam 5 is properly collimated by the collimating device 2 in a direction away from the support plate 4. Without proper location control of the collimating device 2, the laser beam 5 cannot be properly collimated. It is therefore important to fabricate and assemble the apparatus 100 with tight precision to maintain good collimation or to fix the divergence of the laser beam 5.

Figure 5A:
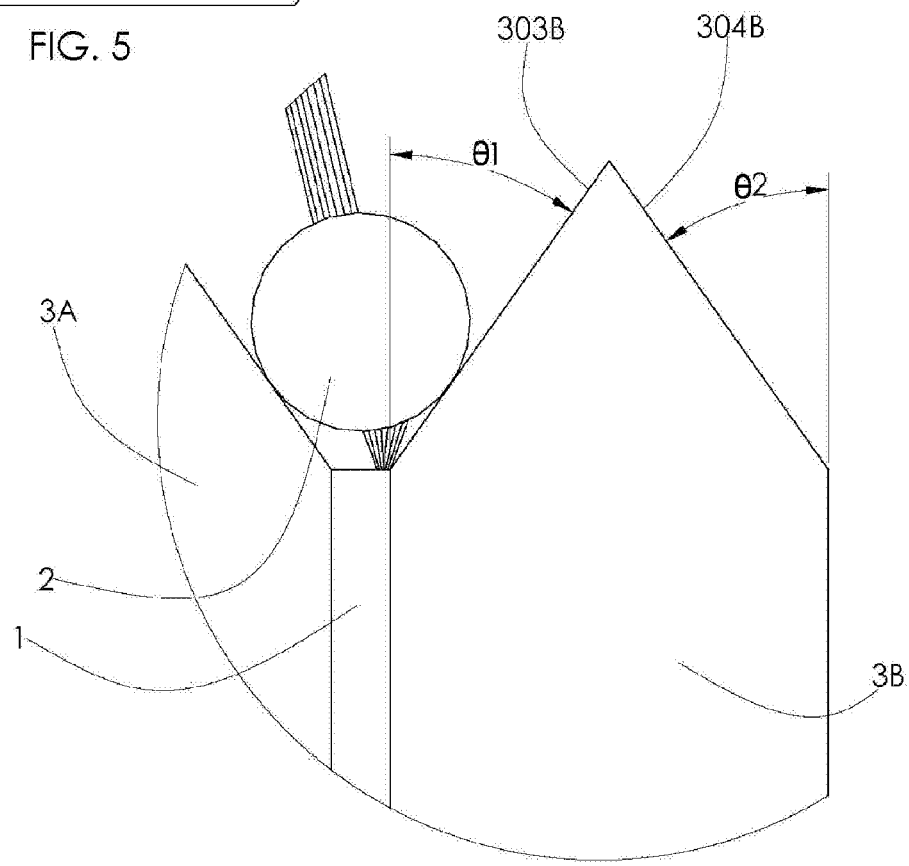

FIG. 5A illustrates an enlarged section A of FIG. 5. As shown in FIG. 5A, the collimating device 2 rests on the second edges of the first and the second fin structures 3A, 3B. The second edges of the first and the second fin structures 3A, 3B are chemically etched to produce an angle $\theta 1$ as measured from one of primary surfaces and an angle $\theta 2$ as measured from the other primary surface, where $\theta 1$ and $\theta 2$ may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 3A, 3B is designed so that the sloped surfaces can hold the collimating device 2 in proper position for maintaining an optical working distance so that the collimating device 2 collimates the laser beam 5.

FIG. 6 illustrates an apparatus 200 according to one non-limiting illustrated embodiment. The light emitter 1 is physically coupled between the first fin structure 7A and the second fin structure 7B, which are attached to the support plate 4. The first fin structure 7A has primary surfaces 701A, 702A and a second edge having sloped surfaces 703A, 704A. The second fin structure 7B has primary surfaces 701B, 702B and a second edge having sloped surfaces 703B, 704B. In one embodiment, the first and the second fin structures 7A, 7B are each made from a single-crystal silicon wafer but have asymmetric shapes. At least a portion of some or all of the surfaces 701A, 702A, 703A, 704A of the first fin structure 7A and the surfaces 701B, 702B, 703B, 704B of the second fin structure 7B are metalized.

A collimating device 6 is attached to the sloped surface 704A of the first fin structure 7A and the sloped surface 703B of the second fin structure 7B. In one embodiment, the light emitter 1 is a laser diode bar that emits a laser beam 5. The laser beam 5 emits from one side of light emitter 1 as shown in FIG. 6 and propagates through the collimating device 6. With the collimating device 6 positioned and distanced appropriately from the light emitter 1, the laser beam 5 is properly collimated by the collimating device 6 in a direction away from the support plate 4. Since the laser beam 5 emits from one side of light emitter 1, the first fin structure 7A is constructed to lift the collimating device 6 to catch the laser beam 5 at the center of the collimating device 6 as shown in FIG. 6. The centering of the laser beam 5 to collimating device 6 is done by fabricating asymmetric pieces of fin structures for the first and the second fin structures 7A, 7B. The slopes holding the collimating device 6 in the first and the second fin structures 7A, 7B are designed to hold the collimating device 6 in position to maintain an optical working distance of the collimating device 6 to collimate the laser beam 5. Without proper location control of the collimating device 6, the laser beam 5 cannot be properly collimated. It is therefore important to fabricate and assemble the apparatus 200 with tight precision to maintain good collimation or to fix the divergence of the laser beam 5.

FIG. 6A illustrates an enlarged section A of FIG. 6. As shown in FIG. 6A, the collimating device 6 rests on the second edges of the first and the second fin structures 7A, 7B. The second edges of the first and the second fin structures 7A, 7B are chemically etched to produce an angle $\theta 3$ as measured from one of primary surfaces and an angle $\theta 4$ as measured from the other primary surface, where $\theta 3$ and $\theta 4$ may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 7A, 7B is designed so that the sloped surfaces can hold the collimating device 6 in proper position for maintaining an optical working distance so that the collimating device 6 collimates the laser beam 5.

Figure 7:
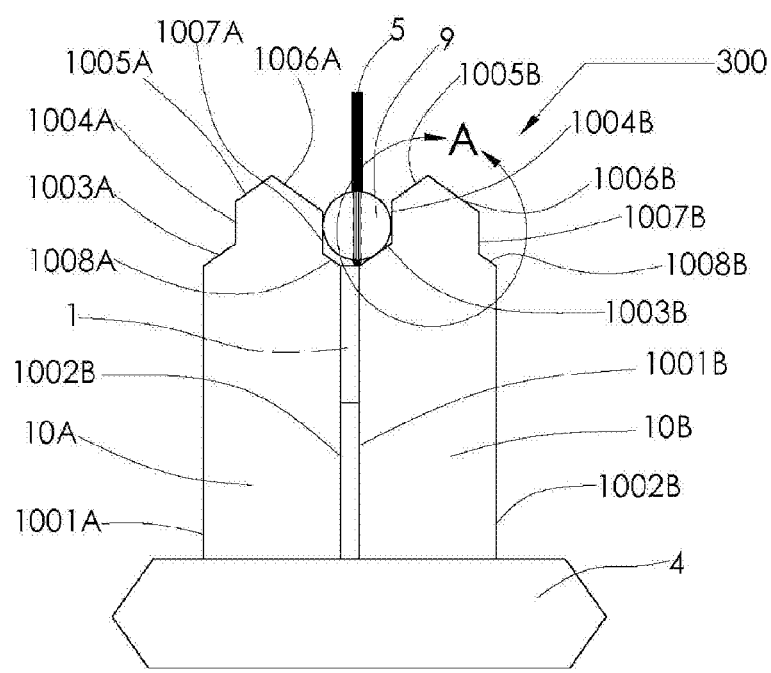
FIGS. 7 and 7A are each a side view of the apparatus shown in FIG. 4 according to another non-limiting illustrated embodiment.

FIG. 7 illustrates an apparatus 300 according to one non-limiting illustrated embodiment. The light emitter 1 is physically coupled between the first fin structure 10A and the second fin structure 10B, which are attached to the support plate 4. The first fin structure 10A has primary surfaces 1001A, 1002A and a second edge having sloped surfaces 1003A, 1005A, 1006A, 1008A. The second fin structure 10B has primary surfaces 1001B, 1002B and a second edge having sloped surfaces 1003B, 1005B, 1006B, 1008B. In one embodiment, the first and the second fin structures 10A, 10B are each made from a single-crystal silicon wafer and have symmetric shapes. At least a portion of some or all of the surfaces 1001A, 1002A, 1003A, 1004A, 1005A, 1006A, 1007A, 1008A of the first fin structure 10A and the surfaces 1001B, 1002B, 1003B, 1004B, 1005B, 1006B, 1007B, 1008B of the second fin structure 10B are metalized.

A collimating device 9 is attached to the vertical surface 1007A of the first fin structure 10A and the sloped surface 1003B and vertical surface 1004B of the second fin structure 10B. In one embodiment, the light emitter 1 is a laser diode bar that emits a laser beam 5. The laser beam 5 emits from one side of light emitter 1 as shown in FIG. 7 and propagates through the collimating device 9. With the collimating device 9 positioned and distanced appropriately from the light emitter 1, the laser beam 5 is properly collimated by the collimating device 9 in a direction away from the support plate 4. Since the laser beam 5 emits from one side of light emitter 1, the first fin structure 10A is constructed to lift the collimating device 9 to catch the laser beam 5 at the center of the collimating device 9 as shown in FIG. 7. The centering of the laser beam 5 to the collimating device 9 is done by fabricating symmetric pieces of fin structures for the first and the second fin structures 10A, 10B. The slopes holding the collimating device 9 in the first and the second fin structures 10A, 10B are designed to hold the collimating device 9 in position to maintain an optical working distance of the collimating device 9 to collimate the laser beam 5. Without proper location control of the collimating device 9, the laser beam 5 cannot be properly collimated. It is therefore important to fabricate and assemble the apparatus 300 with tight precision to maintain good collimation or to fix the divergence of the laser beam 5.

Figure 7A:
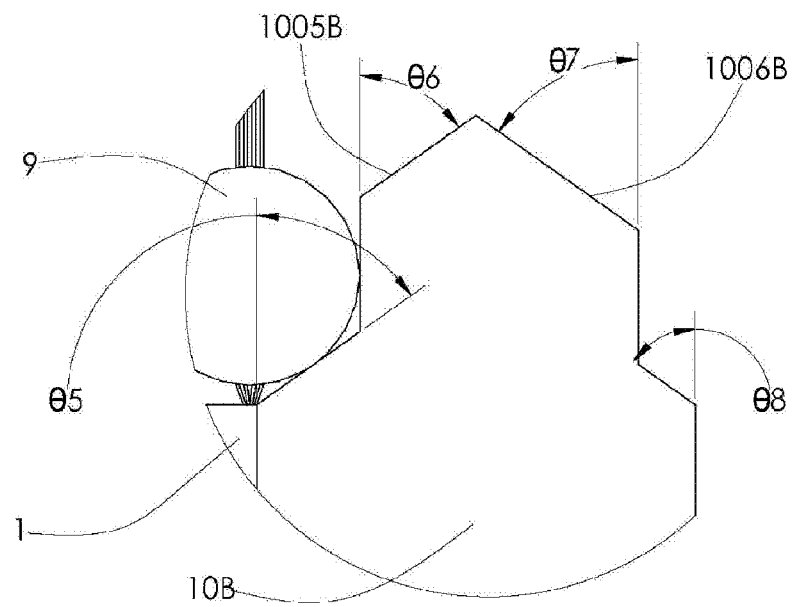

FIG. 7A illustrates an enlarged section A of FIG. 7. As shown in FIG. 7A, the collimating device 9 rests on the second edges of the first and the second fin structures 10A, 10B. The second edges of the first and the second fin structures 10A, 10B are chemically etched to produce angles $\theta 5$, $\theta 6$ as measured from one of primary surfaces and angles $\theta 7$, $\theta 8$ as measured from the other primary surface, where $\theta 5$, $\theta 6$, $\theta 7$, $\theta 8$ may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 10A, 10B is designed so that the sloped surfaces can hold the collimating device 9 in proper position for maintaining an optical working distance so that the collimating device 9 collimates the laser beam 5.

Figure 8:
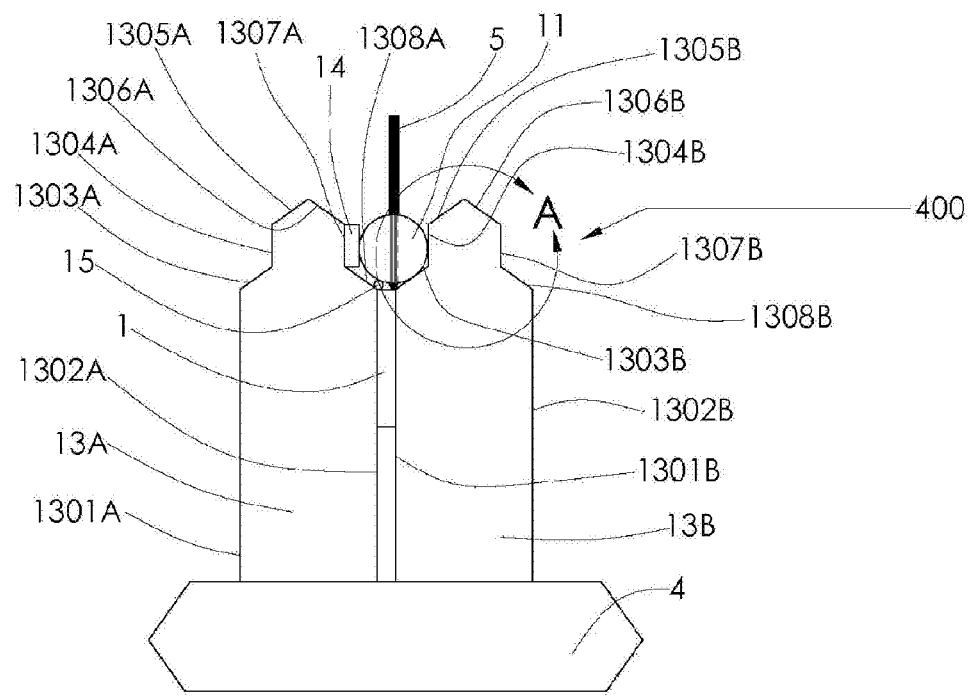
FIGS. 8 and 8A are each a side view of the apparatus shown in FIG. 4 according to another non-limiting illustrated embodiment.

FIG. 8 illustrates an apparatus 400 according to one non-limiting illustrated embodiment. The light emitter 1 is physically coupled between the first fin structure 13A and the second fin structure 13B, which are attached to the support plate 4. The first fin structure 13A has primary surfaces 1301A, 1302A and a second edge having sloped surfaces 1303A, 1305A, 1306A, 1308A. The second fin structure 13B has primary surfaces 1301B, 1302B and a second edge having sloped surfaces 1303B, 1305B, 1306B, 1308B. In one embodiment, the first and the second fin structures 13A, 13B are each made from a single-crystal silicon wafer and have symmetric shapes. At least a portion of some or all of the surfaces 1301A, 1302A, 1303A, 1304A, 1305A, 1306A, 1307A, 1308A of the first fin structure 13A and the surfaces 1301B, 1302B, 1303B, 1304B, 1305B, 1306B, 1307B, 1308B of the second fin structure 13B are metalized.

A collimating device 11 is attached to the sloped surface 1303B and vertical surface 1304B of the second fin structure 13B. In one embodiment, the light emitter 1 is a laser diode bar that emits a laser beam 5. The laser beam 5 emits from one side of light emitter 1 as shown in FIG. 8 and propagates through the collimating device 11. With the collimating device 11 positioned and distanced appropriately from the light emitter 1, the laser beam 5 is properly collimated by the collimating device 11 in a direction away from the support plate 4. Since the laser beam 5 emits from one side of the light emitter 1, the first and the second fin structures 13A, 13B are constructed to catch the laser beam 5 at the center of the collimating device 11 as shown in FIG. 8. In order to maintain the proper position of the collimating device 11, a shim 14 and spacer 15 are used to hold the collimating device 11 in place. The centering of the laser beam 5 to the collimating device 11 is done by fabricating symmetric pieces of fin structures for the first and the second fin structures 13A, 13B, with the use of the shim 14 and the spacer 15. The slopes holding the collimating device 11 in the first and the second fin structures 13A, 13B are designed to hold the collimating device 11 in position, with the aid of the shim 14 and the spacer 15, to maintain an optical working distance of the collimating device 11 to collimate the laser beam 5. Without proper location control of the collimating device 11, the laser beam 5 cannot be properly collimated. It is therefore important to fabricate and assemble the apparatus 400 with tight precision to maintain good collimation or to fix the divergence of the laser beam 5.

Figure 8A:
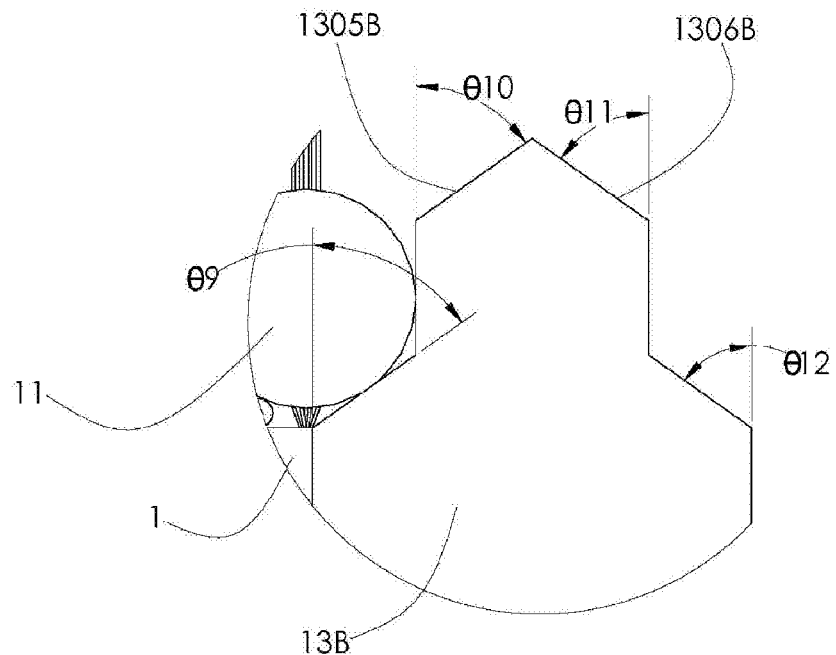

FIG. 8A illustrates an enlarged section A of FIG. 8. As shown in FIG. 8A, the collimating device 11 rests on the second edges of the first and the second fin structures 13A, 13B. The second edges of the first and the second fin structures 13A, 13B are chemically etched to produce angles $\theta 9$, $\theta 10$ as measured from one of primary surfaces and angles $\theta 11$, $\theta 12$ as measured from the other primary surface, where $\theta 9$, $\theta 10$, $\theta 11$, $\theta 12$ may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 13A, 13B is designed so that the sloped surfaces can hold the collimating device 11 in proper position for maintaining an optical working distance so that the collimating device 11 collimates the laser beam 5.

Figure 9:
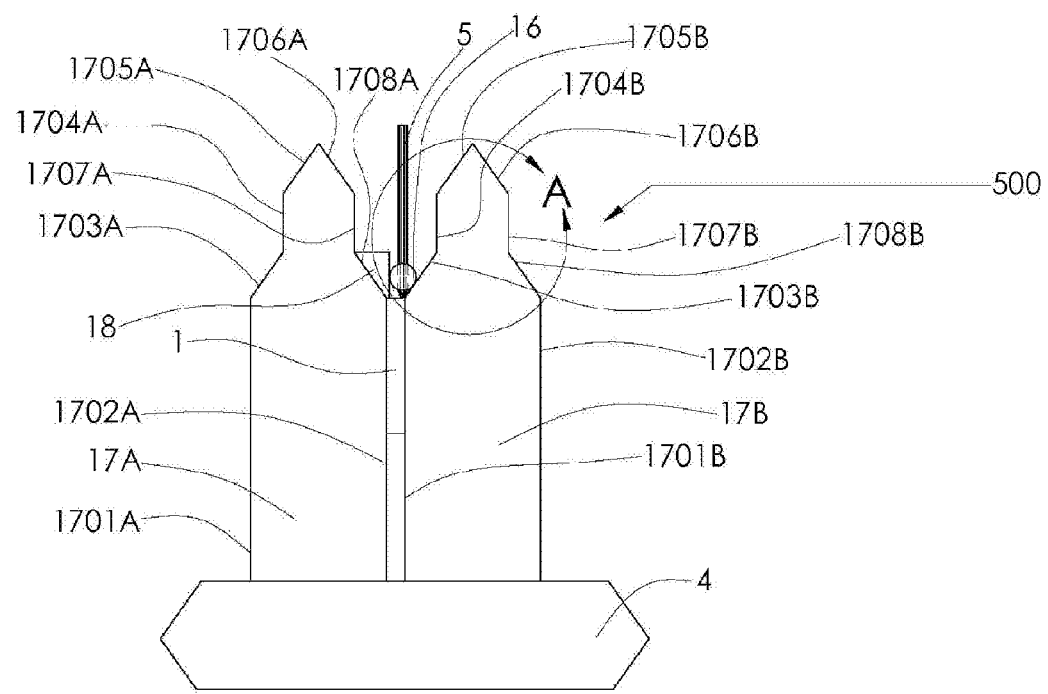
FIGS. 9 and 9A are each a side view of the apparatus shown in FIG. 4 according to another non-limiting illustrated embodiment.

FIG. 9 illustrates an apparatus 500 according to one non-limiting illustrated embodiment. The light emitter 1 is physically coupled between the first fin structure 17A and the second fin structure 17B, which are attached to the support plate 4. The first fin structure 17A has primary surfaces 1701A, 1702A and a second edge having sloped surfaces 1703A, 1705A, 1706A, 1708A. The second fin structure 17B has primary surfaces 1701B, 1702B and a second edge having sloped surfaces 1703B, 1705B, 1706B, 1708B. In one embodiment, the first and the second fin structures 17A, 17B are each made from a single-crystal silicon wafer and have symmetric shapes. At least a portion of some or all of the surfaces 1701A, 1702A, 1703A, 1704A, 1705A, 1706A, 1707A, 1708A of the first fin structure 17A and the surfaces 1701B, 1702B, 1703B, 1704B, 1705B, 1706B, 1707B, 1708B of the second fin structure 17B are metalized.

A collimating device 16 is attached to the sloped surface 1703B of the second fin structure 17B. In one embodiment, the light emitter 1 is a laser diode bar that emits a laser beam 5. The laser beam 5 emits from one side of light emitter 1 as shown in FIG. 9 and propagates through the collimating device 16. With the collimating device 16 positioned and distanced appropriately from the light emitter 1, the laser beam 5 is properly collimated by the collimating device 16 in a direction away from the support plate 4. Since the laser beam 5 emits from one side of the light emitter 1, the first and the second fin structures 17A, 17B are constructed to catch the laser beam 5 at the center of the collimating device 16 as shown in FIG. 9. In order to maintain the proper position of the collimating device 16, a wedge shim 18 is used to hold the collimating device 16 in place. The centering of the laser beam 5 to the collimating device 16 is done by fabricating symmetric pieces of fin structures for the first and the second fin structures 17A, 17B, with the use of the wedge shim 18. The slopes holding the collimating device 16 in the first and the second fin structures 17A, 17B are designed to hold the collimating device 16 in position, with the aid of the wedge shim 17, to maintain an optical working distance of the collimating device 16 to collimate the laser beam 5. Without proper location control of the collimating device 16, the laser beam 5 cannot be properly collimated. It is therefore important to fabricate and assemble the apparatus 500 with tight precision to maintain good collimation or to fix the divergence of the laser beam 5.

Figure 9A:
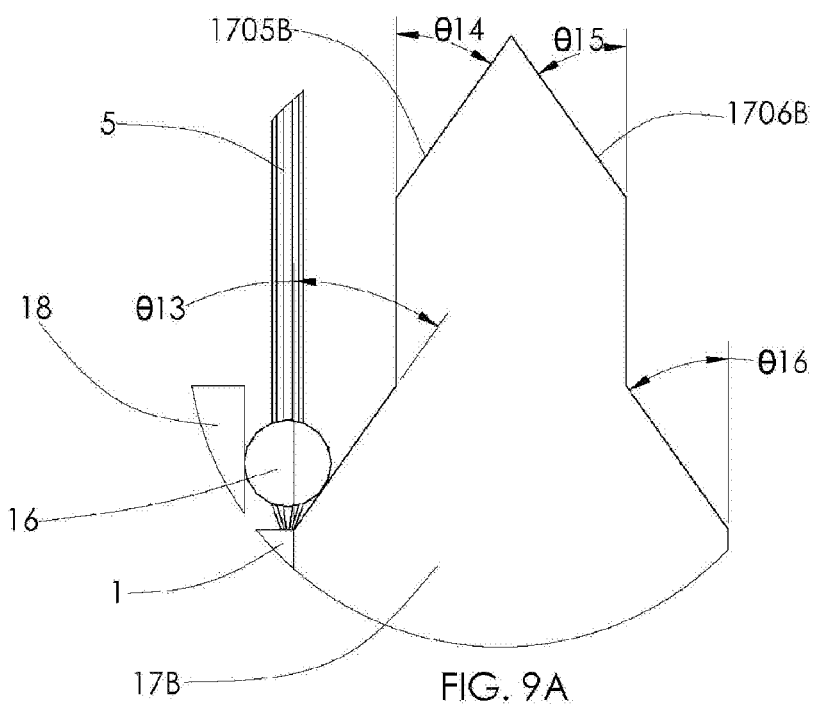

FIG. 9A illustrates an enlarged section A of FIG. 9. As shown in FIG. 9A, the collimating device 16 rests on the second edges of the first and the second fin structures 17A, 17B. The second edges of the first and the second fin structures 17A, 17B are chemically etched to produce angles $\theta 13$, $\theta 14$ as measured from one of primary surfaces and angles $\theta 15$, $\theta 16$ as measured from the other primary surface, where $\theta 13$, $\theta 14$, $\theta 15$, $\theta 16$ may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 17A, 17B is designed so that the sloped surfaces can hold the collimating device 16 in proper position for maintaining an optical working distance so that the collimating device 16 collimates the laser beam 5.

Figure 10:
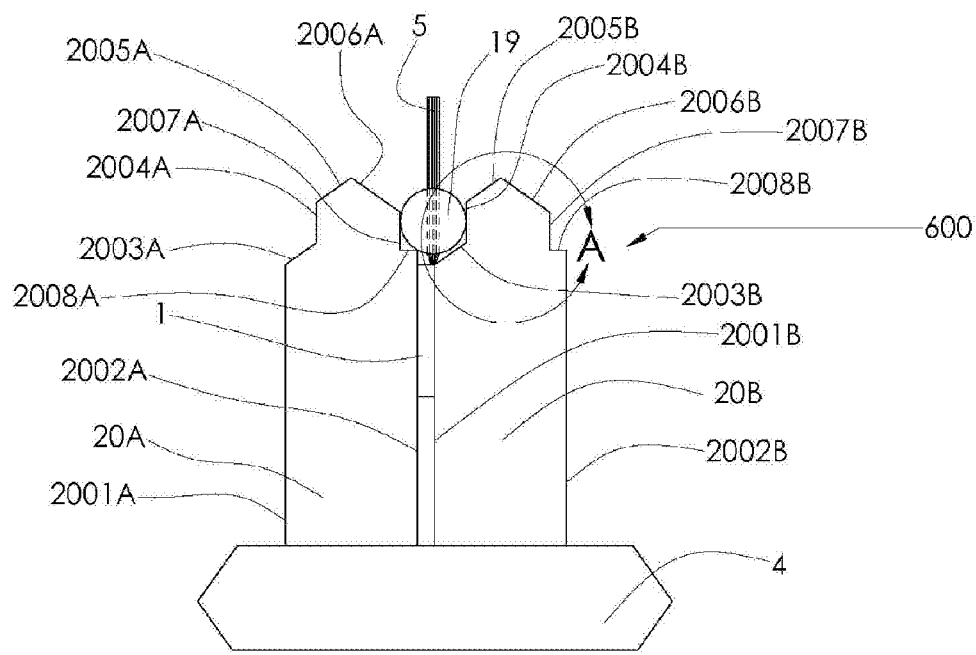
FIGS. 10 and 10A are each a side view of the apparatus shown in FIG. 4 according to another non-limiting illustrated embodiment.

FIG. 10 illustrates an apparatus 600 according to one non-limiting illustrated embodiment. The light emitter 1 is physically coupled between the first fin structure 20A and the second fin structure 20B, which are attached to the support plate 4. The first fin structure 20A has primary surfaces 2001A, 2002A and a second edge having sloped surfaces 2003A, 2005A, 2006A. The second fin structure 20B has primary surfaces 2001B, 2002B and a second edge having sloped surfaces 2003B, 2005B, 2006B. In one embodiment, the first and the second fin structures 20A, 20B are each made from a single-crystal silicon wafer and have symmetric shapes. At least a portion of some or all of the surfaces 2001A, 2002A, 2003A, 2004A, 2005A, 2006A, 2007A, 2008A of the first fin structure 20A and the surfaces 2001B, 2002B, 2003B, 2004B, 2005B, 2006B, 2007B, 2008B of the second fin structure 20B are metalized.

A collimating device 19 is attached to the vertical surface 2007A of the first fin structure 20A and the vertical surface 2004B of the second fin structure 20B. In one embodiment, the light emitter 1 is a laser diode bar that emits a laser beam 5. The laser beam 5 emits from one side of light emitter 1 as shown in FIG. 10 and propagates through the collimating device 19. With the collimating device 19 positioned and distanced appropriately from the light emitter 1, the laser beam 5 is properly collimated by the collimating device 19 in a direction away from the support plate 4. Since the laser beam 5 emits from one side of the light emitter 1, the first and the second fin structures 20A, 20B are constructed to catch the laser beam 5 at the center of the collimating device 19 as shown in FIG. 10. The centering of the laser beam 5 to the collimating device 19 is done by fabricating symmetric pieces of fin structures for the first and the second fin structures 20A, 20B. The vertical walls and edges holding the collimating device 19 in the first and the second fin structures 20A, 20B are designed to hold the collimating device 19 in a proper position for maintaining an optical working distance of the collimating device 19 to collimate the laser beam 5. Without proper location control of the collimating device 19, the laser beam 5 cannot be properly collimated. It is therefore important to fabricate and assemble the apparatus 600 with tight precision to maintain good collimation or to fix the divergence of the laser beam 5.

Figure 10A:
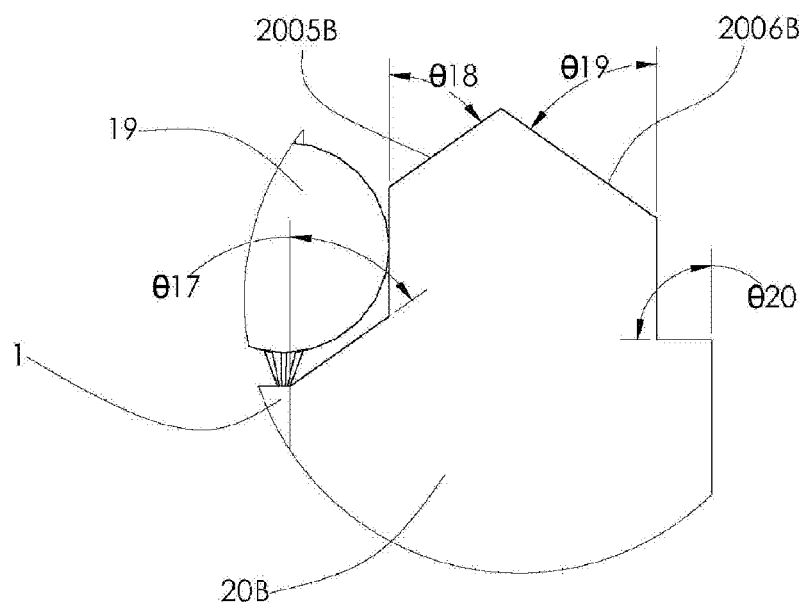

FIG. 10A illustrates an enlarged section A of FIG. 10. As shown in FIG. 10A, the collimating device 19 rests on the second edges of the first and the second fin structures 20A, 20B. The second edges of the first and the second fin structures 20A, 20B are chemically etched to produce angles $\theta 17$, $\theta 18$ as measured from one of primary surfaces and angles $\theta 19$, $\theta 20$ as measured from the other primary surface, where $\theta 17$, $\theta 18$, $\theta 19$ may or may not be equal and each may be 54.7 or 35.3 degrees. The angle $\theta 20$ is a 90-degree angle as measured from the same primary surface the angle $\theta 19$ is measured from. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 20A, 20B is designed so that the sloped surfaces can hold the collimating device 19 in proper position for maintaining an optical working distance so that the collimating device 19 collimates the laser beam 5.

Figure 11:
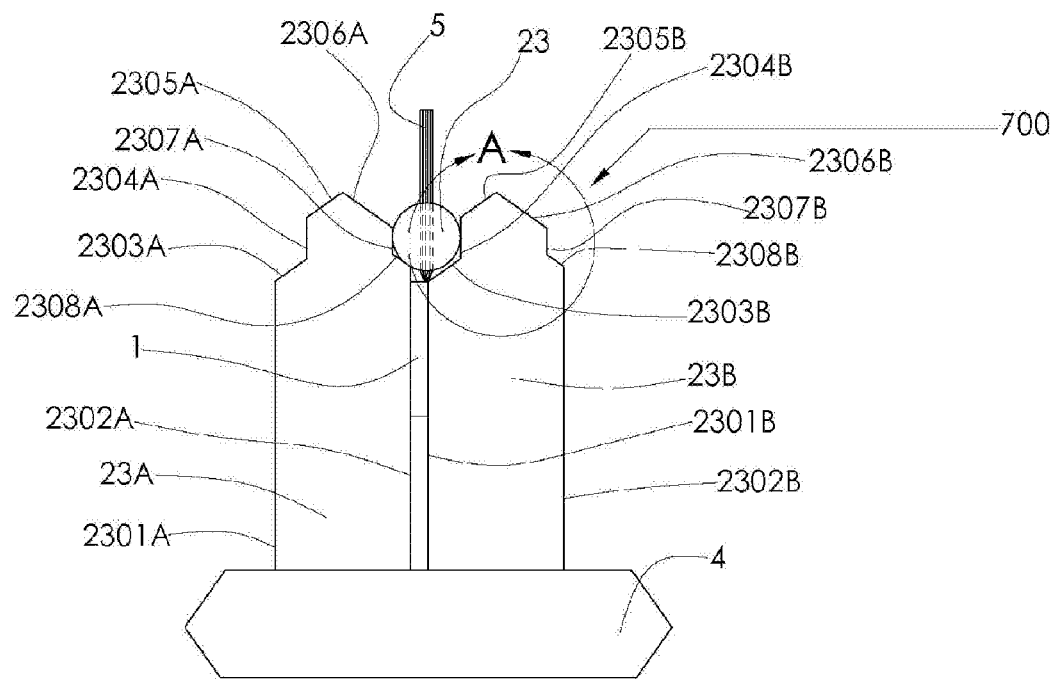
FIGS. 11 and 11A are each a side view of the apparatus shown in FIG. 4 according to another non-limiting illustrated embodiment.

FIG. 11 illustrates an apparatus 700 according to one non-limiting illustrated embodiment. The light emitter 1 is physically coupled between the first fin structure 23A and the second fin structure 23B, which are attached to the support plate 4. The first fin structure 23A has primary surfaces 2301A, 2302A and a second edge having sloped surfaces 2303A, 2305A, 2306A, 2308A. The second fin structure 23B has primary surfaces 2301B, 2302B and a second edge having sloped surfaces 2303B, 2305B, 2306B, 2308B. In one embodiment, the first and the second fin structures 23A, 23B are each made from a single-crystal silicon wafer and have symmetric shapes. At least a portion of some or all of the surfaces 2301A, 2302A, 2303A, 2304A, 2305A, 2306A, 2307A, 2308A of the first fin structure 23A and the surfaces 2301B, 2302B, 2303B, 2304B, 2305B, 2306B, 2307B, 2308B of the second fin structure 23B are metalized.

A collimating device 23 is attached to the sloped surfaces 2307A and 2308A of the first fin structure 23A and the vertical surface 2304B of the second fin structure 23B. In one embodiment, the light emitter 1 is a laser diode bar that emits a laser beam 5. The laser beam 5 emits from one side of light emitter 1 as shown in FIG. 11 and propagates through the collimating device 23. With the collimating device 23 positioned and distanced appropriately from the light emitter 1, the laser beam 5 is properly collimated by the collimating device 23 in a direction away from the support plate 4. Since the laser beam 5 emits from one side of the light emitter 1, the first and the second fin structures 23A, 23B are constructed to catch the laser beam 5 at the center of the collimating device 23 as shown in FIG. 11. The centering of the laser beam 5 to the collimating device 23 is done by fabricating symmetric pieces of fin structures for the first and the second fin structures 23A, 23B. The slope and vertical wall holding the collimating device 23 in the first and the second fin structures 23A, 23B are designed to hold the collimating device 23 in a proper position for maintaining an optical working distance of the collimating device 23 to collimate the laser beam 5. Without proper location control of the collimating device 23, the laser beam 5 cannot be properly collimated. It is therefore important to fabricate and assemble the apparatus 700 with tight precision to maintain good collimation or to fix the divergence of the laser beam 5.

Figure 11A:
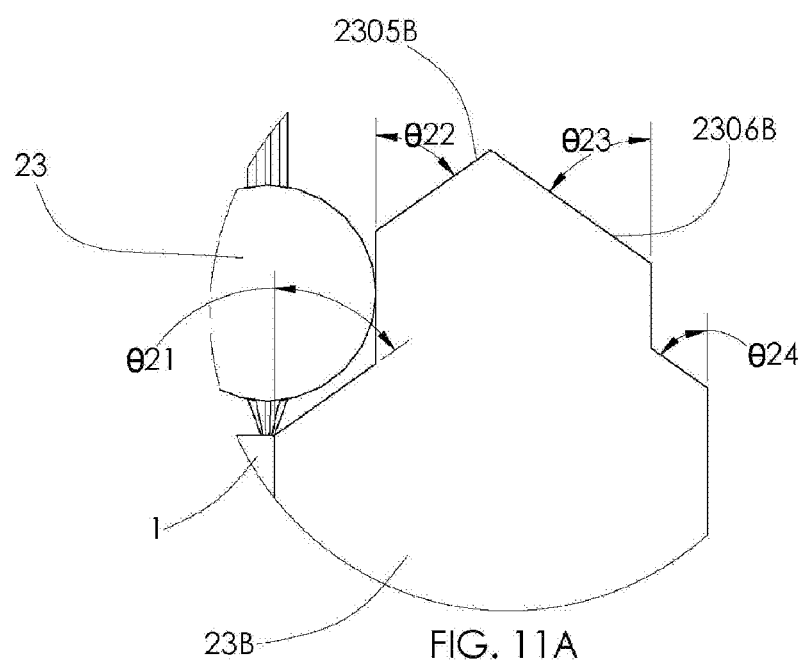

FIG. 11A illustrates an enlarged section A of FIG. 11. As shown in FIG. 11A, the collimating device 23 rests on the second edges of the first and the second fin structures 23A, 23B. The second edges of the first and the second fin structures 23A, 23B are chemically etched to produce angles θ21, θ22 as measured from one of primary surfaces and angles θ23, θ24 as measured from the other primary surface, where θ21, θ22, θ23, θ24 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 23A, 23B is designed so that the sloped surfaces can hold the collimating device 23 in proper position for maintaining an optical working distance so that the collimating device 23 collimates the laser beam 5.

Figure 12:
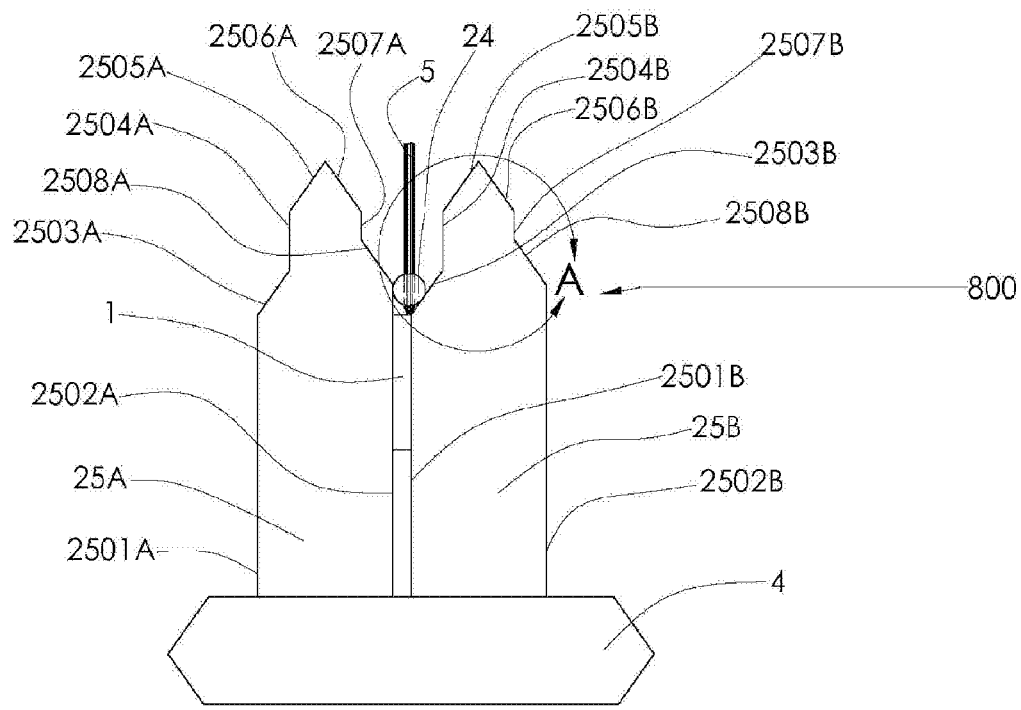
FIGS. 12 and 12A are each a side view of the apparatus shown in FIG. 4 according to another non-limiting illustrated embodiment.

FIG. 12 illustrates an apparatus 800 according to one non-limiting illustrated embodiment. The light emitter 1 is physically coupled between the first fin structure 25A and the second fin structure 25B, which are attached to the support plate 4. The first fin structure 25A has primary surfaces 2501A, 2502A and a second edge having sloped surfaces 2503A, 2505A, 2506A, 2508A. The second fin structure 25B has primary surfaces 2501B, 2502B and a second edge having sloped surfaces 2503B, 2505B, 2506B, 2508B. In one embodiment, the first and the second fin structures 25A, 25B are each made from a single-crystal silicon wafer and have symmetric shapes. At least a portion of some or all of the surfaces 2501A, 2502A, 2503A, 2504A, 2505A, 2506A, 2507A, 2508A of the first fin structure 25A and the surfaces 2501B, 2502B, 2503B, 2504B, 2505B, 2506B, 2507B, 2508B of the second fin structure 25B are metalized.

A collimating device 24 is attached to the vertical primary surface 2502A of the first fin structure 25A and the sloped surface 2503B of the second fin structure 25B. In one embodiment, the light emitter 1 is a laser diode bar that emits a laser beam 5. The laser beam 5 emits from one side of light emitter 1 as shown in FIG. 12 and propagates through the collimating device 24. With the collimating device 24 positioned and distanced appropriately from the light emitter 1, the laser beam 5 is properly collimated by the collimating device 24 in a direction away from the support plate 4. Since the laser beam 5 emits from one side of the light emitter 1, the first and the second fin structures 25A, 25B are constructed to catch the laser beam 5 at the center of the collimating device 24 as shown in FIG. 12. The centering of the laser beam 5 to the collimating device 24 is done by fabricating symmetric pieces of fin structures for the first and the second fin structures 25A, 25B. The slope and vertical wall holding the collimating device 24 in the first and the second fin structures 25A, 25B are designed to hold the collimating device 24 in a proper position for maintaining an optical working distance of the collimating device 24 to collimate the laser beam 5. Without proper location control of the collimating device 24, the laser beam 5 cannot be properly collimated. It is therefore important to fabricate and assemble the apparatus 800 with tight precision to maintain good collimation or to fix the divergence of the laser beam 5.

Figure 12A:
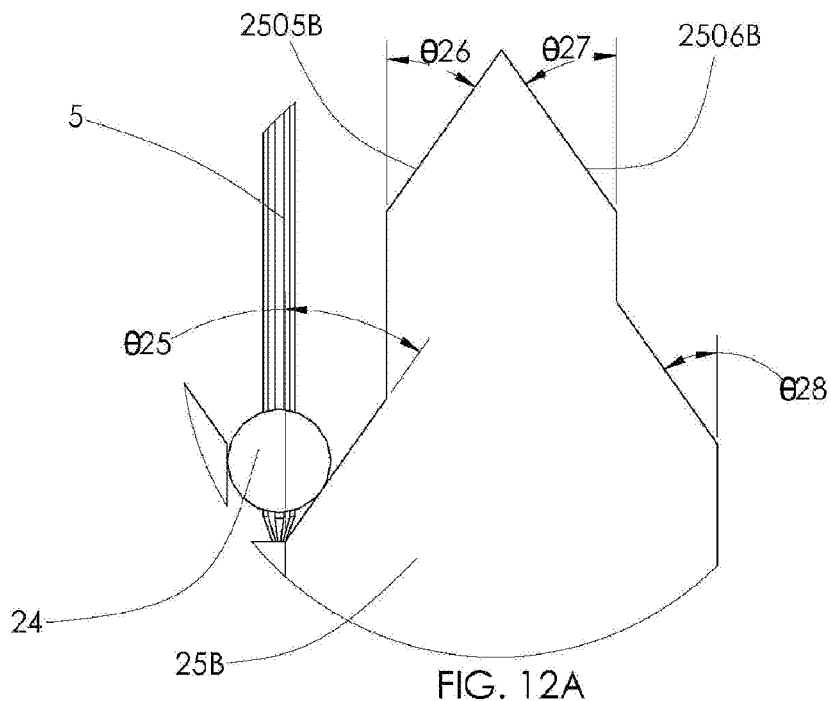

FIG. 12A illustrates an enlarged section A of FIG. 12. As shown in FIG. 12A, the collimating device 24 rests on the second edges of the first and the second fin structures 25A, 25B. The second edges of the first and the second fin structures 25A, 25B are chemically etched to produce angles θ25, θ26 as measured from one of primary surfaces and angles θ27, θ28 as measured from the other primary surface, where θ25, θ26, θ27, θ28 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 25A, 25B is designed so that the sloped surfaces can hold the collimating device 24 in proper position for maintaining an optical working distance so that the collimating device 24 collimates the laser beam 5.

Figure 13:
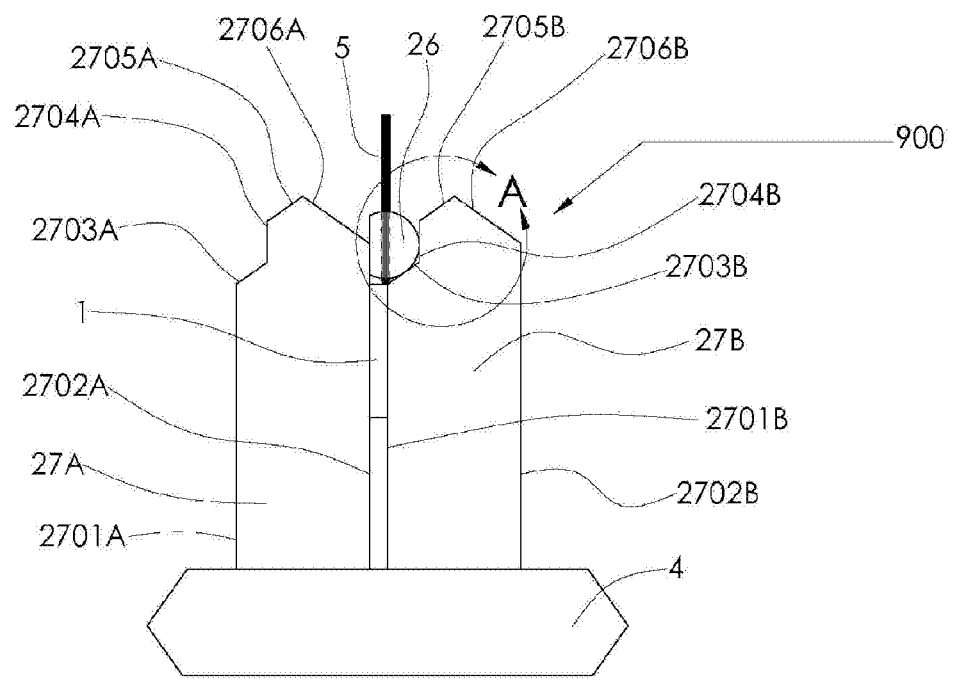
FIGS. 13 and 13A are each a side view of the apparatus shown in FIG. 4 according to another non-limiting illustrated embodiment.

FIG. 13 illustrates an apparatus 900 according to one non-limiting illustrated embodiment. The light emitter 1 is physically coupled between the first fin structure 27A and the second fin structure 27B, which are attached to the support plate 4. The first fin structure 27A has primary surfaces 2701A, 2702A and a second edge having sloped surfaces 2703A, 2705A, 2706A. The second fin structure 27B has primary surfaces 2701B, 2702B and a second edge having sloped surfaces 2703B, 2705B, 2706B. In one embodiment, the first and the second fin structures 27A, 27B are each made from a single-crystal silicon wafer and have symmetric shapes. At least a portion of some or all of the surfaces 2701A, 2702A, 2703A, 2704A, 2705A, 2706A of the first fin structure 27A and the surfaces 2701B, 2702B, 2703B, 2704B, 2705B, 2706B of the second fin structure 27B are metalized.

Figure 13A:
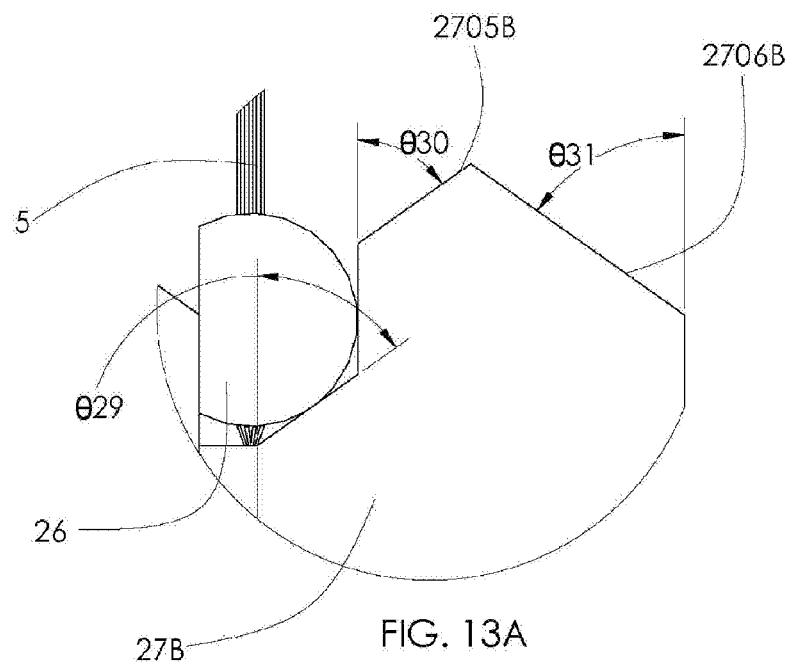

A collimating device 26 is attached to the vertical primary surface 2702A of the first fin structure 27A and the sloped surface 2703B and vertical surface 2704B of the second fin structure 27B. In one embodiment, the light emitter 1 is a laser diode bar that emits a laser beam 5. The laser beam 5 emits from one side of light emitter 1 as shown in FIG. 13 and propagates through the collimating device 26. As shown in FIGS. 13 and 13A, the collimating device 26 is a rod lens having one substantially flat surface along a longitudinal axis of the rod lens so that, by design, the collimating device 26 can fit between the first and the second fin structures 27A, 27B and be positioned to collimate the laser beam 5. With the collimating device 26 positioned and distanced appropriately from the light emitter 1, the laser beam 5 is properly collimated by the collimating device 26 in a direction away from the support plate 4. Since the laser beam 5 emits from one side of the light emitter 1, the first and the second fin structures 27A, 27B are constructed to catch the laser beam 5 at the center of the collimating device 26 as shown in FIG. 13. The centering of the laser beam 5 to the collimating device 26 is done by fabricating symmetric pieces of fin structures for the first and the second fin structures 27A, 27B. The slope and vertical wall holding the collimating device 26 in the first and the second fin structures 27A, 27B are designed to hold the collimating device 26 in a proper position for maintaining an optical working distance of the collimating device 26 to collimate the laser beam 5. Without proper location control of the collimating device 26, the laser beam 5 cannot be properly collimated. It is therefore important to fabricate and assemble the apparatus 900 with tight precision to maintain good collimation or to fix the divergence of the laser beam 5.

FIG. 13A illustrates an enlarged section A of FIG. 13. As shown in FIG. 13A, the collimating device 26 rests on the second edges of the first and the second fin structures 27A, 27B. The second edges of the first and the second fin structures 27A, 27B are chemically etched to produce angles θ29, or θ30 as measured from one of primary surfaces and an angle θ31 as measured from the other primary surface, where θ29, θ30, θ31 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 27A, 27B is designed so that the sloped surfaces can hold the collimating device 26 in proper position for maintaining an optical working distance so that the collimating device 26 collimates the laser beam 5.

Figure 14:
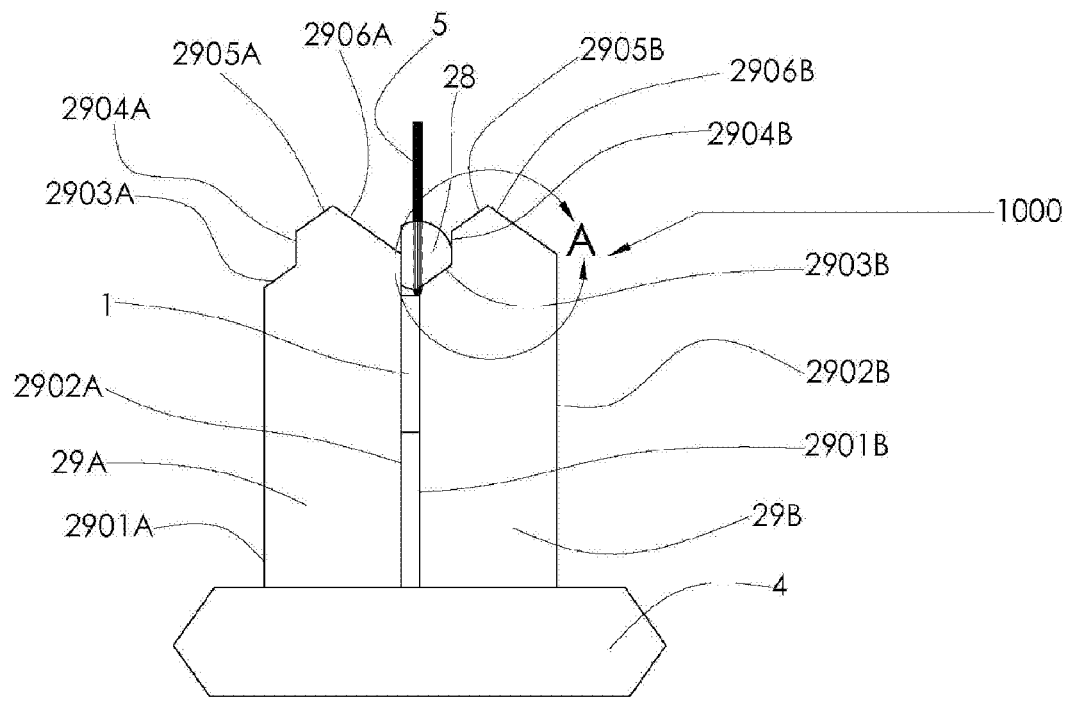
FIGS. 14 and 14A are each a side view of the apparatus shown in FIG. 4 according to another non-limiting illustrated embodiment.

FIG. 14 illustrates an apparatus 1000 according to one non-limiting illustrated embodiment. The light emitter 1 is physically coupled between the first fin structure 29A and the second fin structure 29B, which are attached to the support plate 4. The first fin structure 29A has primary surfaces 2901A, 2902A and a second edge having sloped surfaces 2903A, 2905A, 2906A. The second fin structure 29B has primary surfaces 2901B, 2902B and a second edge having sloped surfaces 2903B, 2905B, 2906B. In one embodiment, the first and the second fin structures 29A, 29B are each made from a single-crystal silicon wafer and have symmetric shapes. At least a portion of some or all of the surfaces 2901A, 2902A, 2903A, 2904A, 2905A, 2906A of the first fin structure 29A and the surfaces 2901B, 2902B, 2903B, 2904B, 2905B, 2906B of the second fin structure 29B are metalized.

Figure 14A:
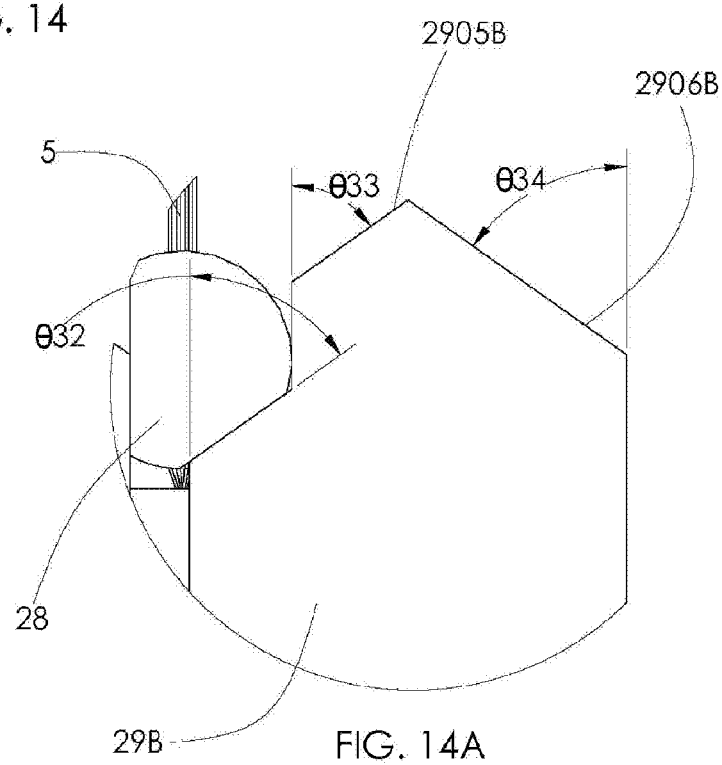

A collimating device 28 is attached to the vertical primary surface 2902A of the first fin structure 29A and the sloped surface 2903B and vertical surface 2904B of the second fin structure 29B. In one embodiment, the light emitter 1 is a laser diode bar that emits a laser beam 5. The laser beam 5 emits from one side of light emitter 1 as shown in FIG. 14 and propagates through the collimating device 28. As shown in FIGS. 14 and 14A, the collimating device 28 is a rod lens having two substantially flat surfaces along a longitudinal axis of the rod lens so that, by design, the collimating device 28 can fit between the first and the second fin structures 29A, 29B and be positioned to collimate the laser beam 5. With the collimating device 28 positioned and distanced appropriately from the light emitter 1, the laser beam 5 is properly collimated by the collimating device 28 in a direction away from the support plate 4. Since the laser beam 5 emits from one side of the light emitter 1, the first and the second fin structures 29A, 29B are constructed to catch the laser beam 5 at the center of the collimating device 28 as shown in FIG. 14. The centering of the laser beam 5 to the collimating device 28 is done by fabricating symmetric pieces of fin structures for the first and the second fin structures 29A, 29B. The slope and vertical wall holding the collimating device 28 in the first and the second fin structures 29A, 29B are designed to hold the collimating device 28 in a proper position for maintaining an optical working distance of the collimating device 28 to collimate the laser beam 5. Without proper location control of the collimating device 28, the laser beam 5 cannot be properly collimated. It is therefore important to fabricate and assemble the apparatus 1000 with tight precision to maintain good collimation or to fix the divergence of the laser beam 5.

FIG. 14A illustrates an enlarged section A of FIG. 14. As shown in FIG. 14A, the collimating device 28 rests on the second edges of the first and the second fin structures 29A, 29B. The second edges of the first and the second fin structures 29A, 29B are chemically etched to produce angles θ32, θ33 as measured from one of primary surfaces and an angle θ34 as measured from the other primary surface, where θ32, θ33, θ34 may or may not be equal and each may be 54.7 or 35.3 degrees. The angle of 54.7 degrees can be achieved by using a single-crystal silicon wafer with a face plane <100> and an edge plane of <110>. The angle of 35.3 degrees can be achieved by using a single-crystal silicon wafer with a face plane <110> and an edge plane of <100>. The sloping of the sloped surfaces of the first and the second fin structures 29A, 29B is designed so that the sloped surfaces can hold the collimating device 28 in proper position for maintaining an optical working distance so that the collimating device 28 collimates the laser beam 5.

Figure 15:
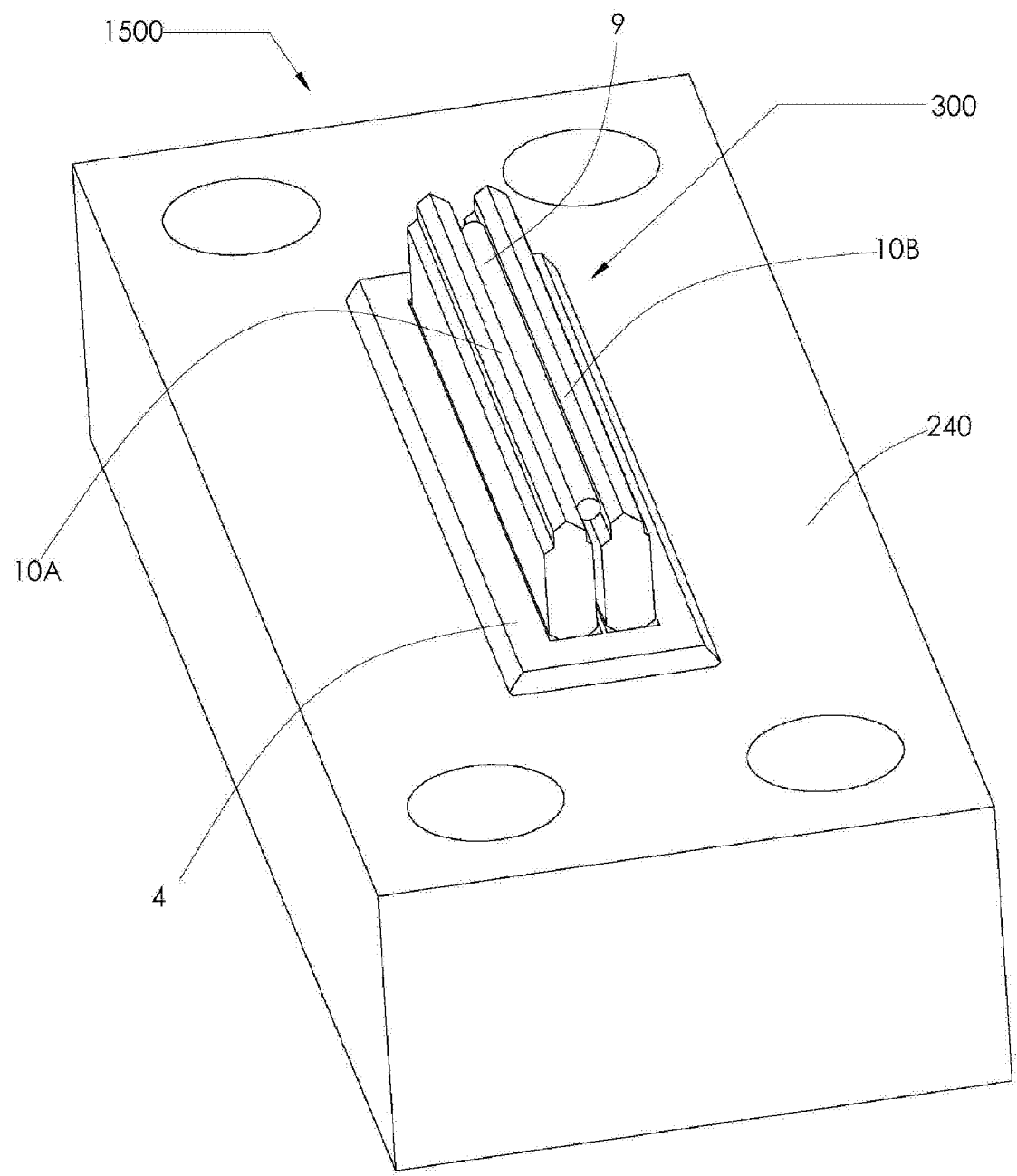
FIG. 15 is a diode laser package according to one non-limiting illustrated embodiment.

FIG. 15 illustrates a diode laser package 1500 according to one non-limiting illustrated embodiment. The package 1500 includes the apparatus 300 and a mounting fixture 240. In other embodiments, instead of the apparatus 300, the package 1500 may include any one of the apparatus 100, apparatus 200, apparatus 400, apparatus 500, apparatus 600, apparatus 700, apparatus 800, apparatus 900, and apparatus 1000. The apparatus 300 is mounted on the mounting fixture 240, and the package 1500 can be further integrated into a system not illustrated. For example, the mounting fixture 240 may be a manifold with fluid channels therein for a cooling fluid, such as water, to flow through the mounting fixture 240 to provide cooling of the apparatus 300 or, more specifically, cooling of the light emitter 1 in the apparatus 300. FIG. 15 shows an integration of the collimating device 9 in a silicon-etched diode laser package that includes the silicon-based first and the second fin structures 10A, 10B, the silicon-based support plate 4, and the light emitter 1. The design of the first and the second fin structures 10A, 10B and the support plate 4 provides great flexibility, simplicity, and repeatability in the integration of the collimating device 9 into the apparatus 300. Thus, such novel design enables the mass production of diode laser packages such as the package 1500 with a great degree of precision for a variety of laser applications.

Figure 16:
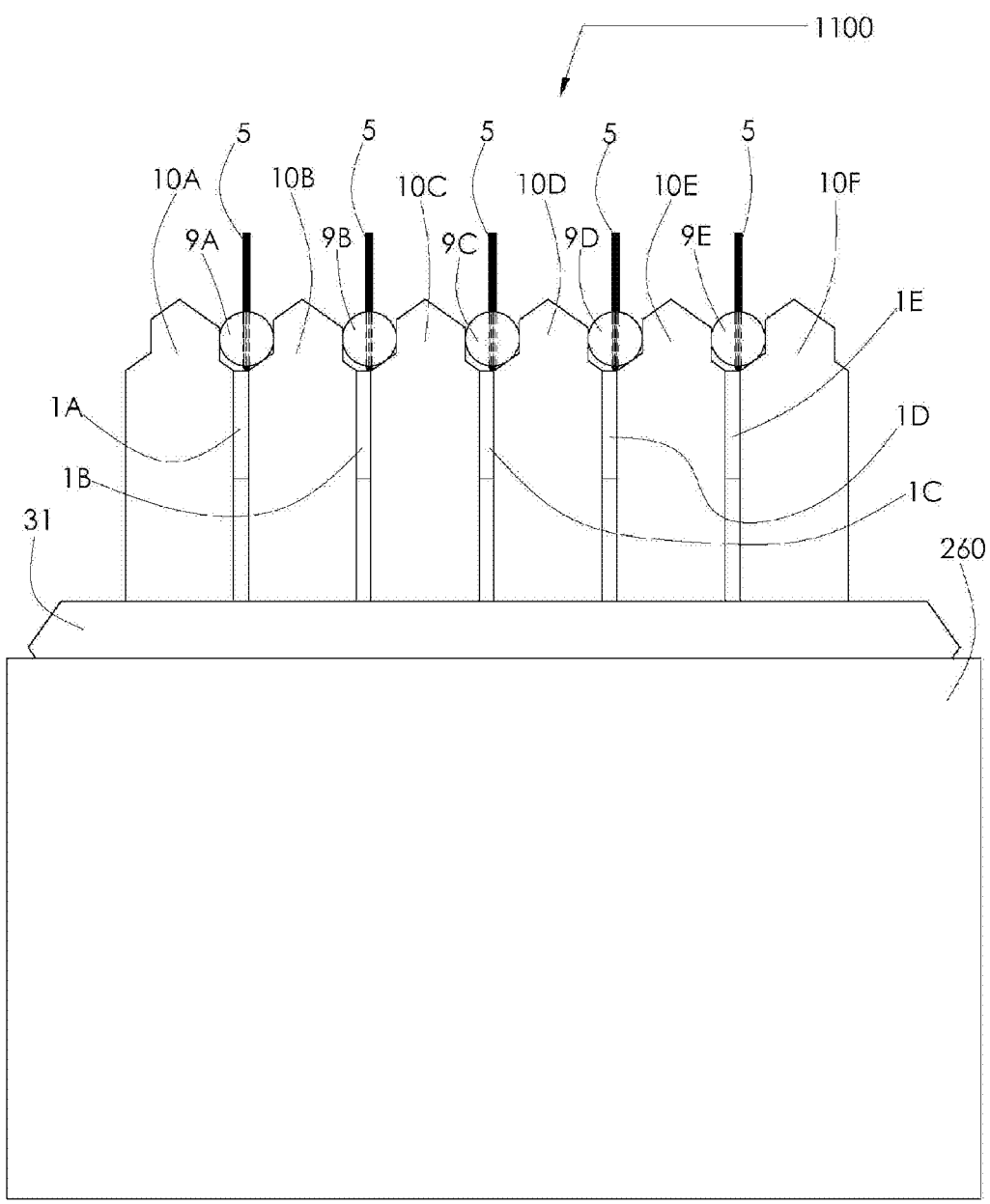
FIG. 16 a multi-emitter apparatus according to one non-limiting illustrated embodiment.

FIG. 16 illustrates a multi-emitter apparatus 1100 according to one non-limiting illustrated embodiment. The apparatus 1100 includes a support plate 31 and a plurality of fin structures 10A, 10B, 10C, 10D, 10E, 10F that are attached to the support plate 31. The apparatus 1100 includes a plurality of light emitters, namely light emitters 1A, 1B, 1C, 1D, 1E. In one embodiment, the light emitters 1A, 1B, 1C, 1D, 1E are diode lasers and each of which emits a respective laser beam 5 in a direction away from the support plate 31 when mounted in place as shown in FIG. 16. The light emitters 1A, 1B, 1C, 1D, 1E are respectively physically coupled between the fin structures 10A, 10B, 10C, 10D, 10E, 10F. In one embodiment, the apparatus 1100 also includes a mounting fixture 260, to which the support plate 31 is physically coupled or otherwise attached to as shown in FIG. 16. The mounting fixture 260 may be a manifold with fluid channels therein for a cooling fluid, such as water, to flow through the mounting fixture 260 to provide cooling of the apparatus 1100 or, more specifically, cooling of the light emitters 1A, 1B, 1C, 1D, 1E in the apparatus 1100. The apparatus 1100 also includes a plurality of collimating devices 9A, 9B, 9C, 9D, 9E. Each of the collimating devices 9A, 9B, 9C, 9D, 9E may be a rod lens and is precisely placed so that the laser beam 5 propagates through the center of the rod lens. Although a number of five light emitters are shown in FIG. 16, in other embodiments the number of light emitters, fin structures, and collimating devices vary, and the size of the support plate 31 can vary accordingly to accommodate the desired number of light emitters. The use of silicon etched structure such as the fin structures 10A, 10B, 10C, 10D, 10E, 10F and the support plate 31 allow simple, repeatable, and precise assembly of the apparatus 1100. The precision collimation and compact packaging can increase the radiance of the diode lasers as well as improve the manufacturability and performance while enabling mass production.

Thus, embodiments of the present disclosure include design schemes for a silicon-based micro-machined lens mounting structure that uses kinematic alignment of a collimating lens such as a rod lens or a high numerical aperture lens. Several alignment schemes are developed to align the collimating lens in a silicon-based support structure, and the collimating lens is placed in the support structure to align the collimating lens to within a few microns of tolerance. The support structure is constructed by bonding two pieces of silicon etched structures to a silicon-based support plate. This support structure permits control of the tolerance error in the silicon micro-etching and the collimating lens specification. Also, other mounting features are micro-etched on the slope of the fin structures for registering the collimating lens to align the collimating lens kinematically. This process allows controlling the mechanical tolerance of the fabricated silicon-based structure to securely position the collimating lens for the UV-curing epoxy or soldering process.

Another advantage of the inventive concept disclosed herein is that it allows one to easily assemble the collimating lens due to a novel design of the kinematic alignment structure. The collimating lens can be placed in an assembly fixture to allow for passively alignment of the diode laser for perfect collimation of the diode laser beam. Two silicon-based fin structures are etched to fabricate a monolithic structure as the mounting structure for a diode laser and a collimating lens. The structures include a vertical or sloped wall that comes naturally from the anisotropic etching process of a <100> or <110> single-crystal silicon wafer. The <100> plane of a single-crystal silicon wafer produces a 54.7-degree angle with the <111> plane of a single-crystal silicon wafer in a face plane of the <100> single-crystal silicon wafer. The <110> plane of the single-crystal silicon wafer can be etched to result in a 35.5-degree angle with the <111> plane of the single-crystal silicon wafer in a face plane of <110> single-crystal silicon wafer. These sloped walls are bonded together to make a groove for the collimating lens. Then, the collimating lens can be dropped in a grooved channel for kinematically aligning the collimating lens. The lens can be actively aligned while the lens is in the groove by using an alignment tool. Since the support structure has kinematic functionality, the lens can be securely positioned for better performance over many thermal cycles of the epoxy or solder bonding.

Due to the monolithic design of the collimating lens mounting, the design of diode laser package is simple and easy to assemble. Most of the current collimation schemes use a separate lens mounting structure to attach the collimating lens, and then the lens mounting structure is mounted on the diode laser package. In this case, perfect alignment of all diode lasers is not feasible and strong radiance is impaired by misalignment of the multi-diode laser stack. To improve the radiance of the multi-diode laser stack, another mounting scheme was developed to align all diode lasers individually for a perfect alignment. However, this alignment process becomes cumbersome in the manufacturing process when the quantity of diode lasers in the multi-diode stack package grows to 10 stacks or more. It is believed that the inventive concept disclose herein addresses the problems associated with previous alignment techniques and improves the brightness of the diode laser package.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other context, not necessarily the exemplary context of silicon-based support structure for diode lasers generally described above.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

I claim:

1. An apparatus, comprising:
  a silicon-based support plate having a first primary surface and a second primary surface opposite the first primary surface;
  a silicon-based first fin structure extending outward from the first primary surface of the support plate and having a first primary surface, a second primary surface opposite the first primary surface, and a plurality of edges between the first and the second primary surfaces including a first edge and a second edge opposite the first edge; and
  a silicon-based second fin structure extending outward from the first primary surface of the support plate and having a first primary surface, a second primary surface opposite the first primary surface, and a plurality of edges between the first and the second primary surfaces including a first edge and a second edge opposite the first edge,
  wherein the respective second edge of at least one of the first fin structure and the second fin structure comprises a V-shaped wedge,
  wherein the second edge of the first fin structure and the second edge of the second fin structure have different heights with respect to the first primary surface of the support plate when the first edge of the first fin structure and the first edge of the second fin structure are received on the first primary surface of the support plate, and
  wherein the support plate includes at least a first V-notch groove and a second V-notch groove on the first primary surface of the support plate, wherein the first fin structure is mounted on the support plate with the first edge of the first fin structure received in the first V-notch groove of the support plate, and wherein the second fin structure is mounted on the support plate with the first edge of the second fin structure received in the second V-notch groove of the support plate.

2. The apparatus of claim 1, wherein at least one of the support plate, the first fin structure, and the second fin structure is made from a single-crystal silicon wafer.

3. The apparatus of claim 1, wherein at least a portion of the first primary surface of the first fin structure is metalized, and wherein at least a portion of the first primary surface of the second fin structure is metalized.

4. The apparatus of claim 1, further comprising:
  an adhesive material interposing at least one of the first and the second fin structures and the support plate, the adhesive material attaching the at least one of the first and the second fin structures to the support plate by metal soldering, epoxy boding, eutectic bonding, anodic bonding, diffusion bonding, or a combination thereof.

5. The apparatus of claim 1 further comprising:
a first light emitter that is disposed between and physically coupled to the first primary surface of the first fin structure and to the first primary surface of the second fin structure.

6. The apparatus of claim 5, wherein the first light emitter comprises a light-emitting diode.

7. The apparatus of claim 5, wherein the first light emitter comprises a diode laser.

8. The apparatus of claim 5 further comprising:
a collimating device disposed on the first and the second fin structures and positioned to collimate a beam of light emitted from the first light emitter.

9. The apparatus of claim 8, wherein the collimating device comprises a rod lens.

10. The apparatus of claim 8, wherein the collimating device comprises a substantially cylindrical lens with a high numerical aperture.

11. The apparatus of claim 8, wherein the collimating device comprises a rod lens having at least one substantially flat surface along a longitudinal axis of the rod lens.

12. The apparatus of claim 8, wherein the collimating device is attached to at least one of the first and the second fin structures by UV-curing epoxy bonding.

13. The apparatus of claim 8, wherein the collimating device is attached to at least one of the first and the second fin structures by soldering.

14. The apparatus of claim 1 further comprising:
a second light emitter configured to emit a second beam of light when powered; and
a silicon-based third fin structure having a first primary surface, a second primary surface opposite the first primary surface, and a plurality of edges between the first and the second primary surfaces including a first edge and a second edge opposite the first edge, the third fin structure physically coupled to the support plate with the first edge of the third fin structure attached to the first primary surface of the support plate,
wherein the second light emitter is physically coupled between the second and the third fin structures to emit the second beam of light in a direction away from the support plate.

15. An apparatus, comprising:
a silicon-based first fin structure having an upper portion and a lower portion with a first surface extending between the upper and lower portions, the upper portion of the first fin structure including a second surface that is sloped and contiguous with respect to the first surface;
a silicon-based second fin structure having an upper portion and a lower portion with a first surface extending between the upper and lower portions of the second fin structure, the upper portion of the second fin structure including a second surface that is sloped and contiguous with respect to the first surface of the second fin structure; and
a silicon-based support member having a receiving surface that receives at least a part of the lower portion of the first fin structure and at least a part of the lower portion of the second fin structure such that the first fin structure and the second fin structure extend outward from the receiving surface of the support member with the respective first surfaces of the first fin structure and the second fin structure facing each other when the first and second fin structures are received by the support member, wherein:
with the first fin structure and the second fin structure received by the support member, the second surface of the first fin structure and the second surface of the second fin structure have different heights relative to the receiving surface of the support member such that, when a collimating rod lens is disposed on the second surface of the first fin structure and the second surface of the second fin structure, a longitudinal center line of the collimating rod lens is closer to the first primary surface of the first fin structure than to the first primary surface of the second fin structure; and
wherein the receiving surface of the support member includes a first V-notch groove and a second V-notch groove, and wherein the first V-notch groove interlockingly receives the lower portion of the first fin structure and the second V-notch groove interlockingly receives the lower portion of the second fin structure.

16. The apparatus of claim 15, wherein the upper portions of the first fin structure and the second fin structures are configured to support a collimating rod lens with a longitudinal center line of the collimating rod lens being approximately aligned with the first surface of the first fin structure when the collimating rod lens is disposed on the second surface of the upper portion of the first fin structure and the second surface of the upper portion of the second fin structure.

17. The apparatus of claim 15, wherein at least one of the first fin structure, the second fin structure and the support base substantially comprises a chemically etchable material.

18. The apparatus of claim 17, wherein the chemically etchable material is one of silicon material, a single-crystal silicon wafer, a multi-crystal silicon wafer and a ceramic material.

19. The apparatus of claim 15, wherein at least one of the first fin structure, the second fin structure and the support base is metalized.

20. The apparatus of claim 15, wherein the second surface of the upper portion of the first fin structure is sloped 35.3 degrees with respect to a plane defined by the first surface of the first fin structure.

21. The apparatus of claim 15, wherein the second surface of the upper portion of the second fin structure is sloped 35.3 degrees with respect to a plane defined by the first surface of the second fin structure.

22. The apparatus of claim 15, further comprising:
an adhesive material interposing at least one of the first and the second fin structures and the support member, the adhesive material attaching the at least one of the first and the second fin structures to the support member by metal soldering, epoxy boding, eutectic bonding, anodic bonding, diffusion bonding, or a combination thereof.

23. The apparatus of claim 15, further comprising:
a first edge-emitting light emitter coupled between the first fin structure and the second fin structure.

24. The apparatus of claim 23, further comprising:
a first collimating rod lens having a longitudinal center line and being disposed on the second surface of the upper portion of the first fin structure and the second surface of the upper portion of the second fin structure.

25. An apparatus, comprising:
a silicon-based support member having a receiving surface; and
a silicon-based alignment structure having a mounting end and a distal end opposite the mounting end with the mounting end of the alignment structure received on the receiving surface of the support member, the alignment structure having a first surface and a second surface parallel to and facing the first surface with a gap defined therebetween and configured to receive a light-emitting device completely inside the gap with the first surface and the second surface in contact with the light-emitting device such that, when the light-emitting device is completely received inside the gap, a beam of light emitted by the light-emitting device travels in a direction away from the receiving surface of the support member, the distal end of the alignment structure configured such that, when a collimating rod lens is disposed on the distal end of the alignment structure and over the gap, a longitudinal center line of the collimating rod lens is not aligned with a mid-point of the gap.

26. The apparatus of claim 25, wherein the alignment structure comprises:
   a first fin structure having an upper portion and a lower portion with a first surface extending between the upper and lower portions as the first surface of the alignment structure, the upper portion of the first fin structure including a second surface that is sloped and contiguous with respect to the first surface of the first fin structure and that is configured to receive at least a portion of a collimating rod lens along a longitudinal length of the second surface of the first fin structure; and
   a second fin structure having an upper portion and a lower portion with a first surface extending between the upper and lower portions of the second fin structure as the second surface of the alignment structure, the upper portion of the second fin structure including a second surface that is sloped and contiguous with respect to the first surface of the second fin structure and that is configured to receive at least a portion of the collimating rod lens along a longitudinal length of the second surface of the second fin structure, wherein:
   the lower portion of the first fin structure and the lower portion of the second fin structure form the mounting end of the alignment structure;
   the upper portion of the first fin structure and the upper portion of the second fin structure form the distal end of the alignment structure; and
   the receiving surface of the support member receives at least a part of the lower portion of the first fin structure and at least a part of the lower portion of the second fin structure, the first fin structure and the second fin structure extending outward from the receiving surface of the support member and arranged with the respective first surfaces of the first fin structure and the second fin structure facing each other, approximately parallel, to define the gap between the respective first surfaces of the first fin structure and the second fin structure.

27. The apparatus of claim 26, wherein, when the lower portion of the first fin structure and the lower portion of the second fin structure are received by the receiving surface of the support member, a distance from the receiving surface to the second surface of the first fin structure is different from a distance from the receiving surface to the second surface of the second fin structure.

28. The apparatus of claim 26, wherein the receiving surface of the support member includes a first V-notch groove and a second V-notch groove, and wherein the first V-notch groove interlockingly receives the lower portion of the first fin structure and the second V-notch groove interlockingly receives the lower portion of the second fin structure.

29. The apparatus of claim 26, wherein at least one of the first fin structure, the second fin structure and the support base substantially comprises a chemically etchable material.

30. The apparatus of claim 29, wherein the chemically etchable material is one of silicon material, a single-crystal silicon wafer, a multi-crystal silicon wafer and a ceramic material.

31. The apparatus of claim 26, wherein at least one of the first fin structure, the second fin structure and the support base is metalized.

32. The apparatus of claim 26, wherein the second surface of the upper portion of the first fin structure is sloped 35.3 degrees with respect to a plane defined by the first surface of the first fin structure.

33. The apparatus of claim 26, wherein the second surface of the upper portion of the second fin structure is sloped 35.3 degrees with respect to a plane defined by the first surface of the second fin structure.

34. The apparatus of claim 25, further comprising:
   a light emitter having an emitting side, the light emitter disposed in the gap between the respective first surfaces of the first and the second fin structures with the emitting side adjacent to and in contact with the first surface of the first fin structure.

35. The apparatus of claim 34, wherein, when the collimating rod lens is received along a longitudinal length of the second surface of the first fin structure and a longitudinal length of the second surface of the second fin structure, the longitudinal center line of the collimating lens is approximately aligned with the emitting side of the light emitter.

* * * * *